(12) United States Patent
Cai et al.

(10) Patent No.: US 11,486,734 B2
(45) Date of Patent: Nov. 1, 2022

(54) MAGNETIC SENSOR SYSTEM AND LENS POSITION DETECTION DEVICE

(71) Applicant: TDK CORPORATION, Tokyo (JP)

(72) Inventors: Yongfu Cai, Tokyo (JP); Hayato Miyashita, Tokyo (JP); Tsuyoshi Umehara, Tokyo (JP); Yuta Saito, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/384,939

(22) Filed: Jul. 26, 2021

(65) Prior Publication Data

US 2022/0042826 A1 Feb. 10, 2022

(30) Foreign Application Priority Data

Aug. 4, 2020 (JP) .............................. JP2020-132658

(51) Int. Cl.
*G01D 5/16* (2006.01)

(52) U.S. Cl.
CPC ...................................... *G01D 5/16* (2013.01)

(58) Field of Classification Search
CPC ................. G01R 33/02; G01R 33/06; G01R 33/09–098; G01D 5/12; G01D 5/14; G01D 5/16
See application file for complete search history.

(56) References Cited

U.S. PATENT DOCUMENTS

| 2009/0262466 | A1 | 10/2009 | Kurata et al. |
| 2012/0068698 | A1* | 3/2012 | Chen .................... G01R 33/098 324/252 |
| 2013/0073238 | A1* | 3/2013 | Nomura ................ G01R 33/09 324/252 |
| 2014/0292321 | A1* | 10/2014 | Yamazaki ............ G01R 33/098 324/252 |
| 2015/0253162 | A1 | 9/2015 | Kusumi et al. |
| 2015/0354987 | A1 | 12/2015 | Kusumi et al. |
| 2016/0204161 | A1 | 7/2016 | Suto et al. |
| 2016/0282144 | A1 | 9/2016 | Komasaki |
| 2020/0355758 | A1 | 11/2020 | Tanabe et al. |

FOREIGN PATENT DOCUMENTS

| JP | H06-207834 A | 7/1994 |
| JP | 2012-122792 A | 6/2012 |
| JP | 2016-130686 A | 7/2016 |
| JP | 2016-176911 A | 10/2016 |
| JP | 2017-53798 A | 3/2017 |
| JP | 2017-227825 A | 12/2017 |
| WO | 2018/190261 A1 | 10/2018 |

* cited by examiner

*Primary Examiner* — Huy Q Phan
*Assistant Examiner* — David B Frederiksen
(74) *Attorney, Agent, or Firm* — Oliff PLC

(57) ABSTRACT

A magnetic sensor system includes a magnetic field generator and a magnetic sensor. The magnetic sensor includes a plurality of MR elements. The plurality of MR elements are each configured so that a bias magnetic field in a second direction orthogonal to a first direction is applied to a free layer, and to change in resistance with a strength of a magnetic field component. A maximum strength of the magnetic field component applied to each of the MR elements is greater than or equal to 1.2 times the strength of a bias magnetic field.

15 Claims, 12 Drawing Sheets

MAGNETIC SENSOR SYSTEM AND LENS POSITION DETECTION DEVICE

BACKGROUND OF THE INVENTION

1. Field of the Invention

The present invention relates to a magnetic sensor system and a lens position detection device that uses the magnetic sensor system.

2. Description of the Related Art

As a magnetic sensor system using a magnetic sensor, one configured so that the position of a magnetic field generator, such as a magnetic scale, relative to the magnetic sensor changes within a predetermined range has been known. As the position of the magnetic field generator relative to the magnetic sensor changes, the strength of a component of a target magnetic field, which is generated by the magnetic field generator and applied to the magnetic sensor, in one direction changes. For example, the magnetic sensor detects the strength of the component of the target magnetic field in one direction, and generates two detection signals that correspond to the strength of the component in the one direction and have respective difference phases. The magnetic sensor system generates a detection value having a correspondence with the position of the magnetic field generator relative to the magnetic sensor on the basis of the two detection signals.

The magnetic sensor system includes a detection value generation circuit that generates the detection value. Typically, essential parts of the detection value generation circuit are implemented by a digital signal processor (DSP), an application specific integrated circuit (ASIC), or a microcomputer. The detection value generation circuit generates the detection value based on the detection signals of the magnetic sensor, digitally converted by analog-to-digital converters (hereinafter, also referred to as an A/D converters).

For example, the magnetic sensor system is used for a position detection device that detects the position of a moving object whose position changes in a predetermined direction. The position detection device using the magnetic sensor system will hereinafter be referred to as a magnetic position detection device. The magnetic position detection device is configured so that the position of the magnetic field generator relative to the magnetic sensor changes depending on the change in the position of the moving object. The predetermined direction may be linear or rotational.

Magnetic position detection devices are described, for example, in JP 06-207834 A, US 2015/0354987 A1, and US 2015/0253162 A1. The position detection devices described in the foregoing publications use magnetoresistive elements (hereinafter, also referred to as MR elements) as their magnetic detection elements. The MR elements are located at a predetermined distance from a magnetic recording medium or a magnetic scale.

By the way, magnetic sensor systems and magnetic position detection devices are known to cause distortion in the waveforms of the detection signals of their magnetic sensor due to harmonics. If the output waveforms of the detection signals of the magnetic sensor are distorted, the position of the magnetic field generator relative to the magnetic sensor is unable to be accurately detected. In view of this, the position detection device described in JP 06-207834 A includes a bias magnet that applies a bias magnetic field to the MR elements, whereby distortion components due to the harmonics of the detection signal are removed.

The position detection device described in US 2015/0253162 A1 includes a plurality of MR elements (TMR elements) arranged in the longitudinal direction of a magnetic scale. The MR elements are arranged based on a pitch P that is the wavelength X or one-half of the wavelength X of a recording signal on the magnetic scale, whereby odd-order harmonic distortions of the detection signal are cancelled out.

US 2009/0262466 A1 describes a magnetic encoder including a magnetic sensor and a bar-shaped magnet. The magnetic encoder includes soft magnetic layers located near MR elements, whereby an output magnetic field to be applied to the MR elements is amplified to improve the magnetic detection sensitivities of the MR elements.

Like the position detection devices described in JP 06-207834 A, US 2015/0354987 A1, and US 2015/0253162 A1 and the magnetic encoder described in US 2009/0262466 A1, a magnetic sensor system including a magnetic sensor located at a predetermined distance from a magnetic field generator has the possibility of the distance between the magnetic sensor and the magnetic field generator deviating due to installation precision of the magnetic sensor. If the distance deviates, the detection signals of the magnetic sensor input to the detection value generation circuit change in magnitude. Thus, there has been a problem that the detection signals need to be calibrated lot by lot or product by product, which takes a lot of time and effort.

As the distance between the magnetic sensor and the magnetic field generator decreases, the strength of the target magnetic field applied to the magnetic sensor increases. As a result, the maximum values of the detection signals of the magnetic sensor input to the detection value generation circuit increase. In some cases, the magnitudes of the detection signals can exceed the input ranges of the A/D converters, and the detection signals input to the detection value generation circuit can be saturated. The saturation of the detection signals is problematic because the detection accuracy of the magnetic sensor system deteriorates.

In general, the detection signals are multiplied by a predetermined gain by amplifiers before input to the A/D converters. To prevent the saturation of the detection signals, the gain can be set on the assumption that the distance between the magnetic sensor and the magnetic field generator is minimum. This, however, means that the entire input ranges of the A/D converters are not used, which results in a decrease in both the resolution and detection accuracy.

Moreover, the distance between the magnetic sensor and the magnetic field generator can sometimes deviate due to a physical impact during use. This can also be problematic because the detection signals are saturated and so the detection accuracy of the magnetic sensor system deteriorates.

SUMMARY OF THE INVENTION

An object of the present invention is to provide a magnetic sensor system that can suppress changes in the detection signals due to the deviation of the distance between the magnetic sensor and the magnetic field generator, and a lens position detection device using the magnetic sensor system.

A magnetic sensor system according to the present invention includes a magnetic field generator configured to generate a target magnetic field, and a magnetic sensor configured to detect the target magnetic field. The magnetic sensor and the magnetic field generator are configured so that a strength of a magnetic field component of the target magnetic field detected by the magnetic sensor in a first direction changes with a change in a position of the magnetic field generator relative to the magnetic sensor.

The magnetic sensor includes a plurality of magnetoresistive elements. The plurality of magnetoresistive elements each include a magnetization pinned layer having a magnetization whose direction is fixed, a free layer having a magnetization whose direction is variable depending on a direction and the strength of the magnetic field component, and a gap layer located between the magnetization pinned layer and the free layer. The magnetoresistive elements are configured so that a bias magnetic field in a second direction orthogonal to the first direction is applied to the free layer, and to change in resistance with the strength of the magnetic field component. The maximum strength of the magnetic field component applied to each of the magnetoresistive elements is greater than or equal to 1.2 times the strength of the bias magnetic field.

In the magnetic sensor system according to the present invention, the maximum strength of the magnetic field component applied to each of the magnetoresistive elements may be less than or equal to 15.6 times the strength of the bias magnetic field.

In the magnetic sensor system according to the present invention, the bias magnetic field may be attributed to either an external magnetic field applied to the free layer from outside or an anisotropic magnetic field due to anisotropy of the free layer, or both.

In the magnetic sensor system according to the present invention, the magnetic sensor may further include a bias magnetic field generator configured to generate an external magnetic field to be applied to the free layer. In such a case, the bias magnetic field may be attributed to at least the external magnetic field. The bias magnetic field generator may include a plurality of magnet pairs each including a first magnet and a second magnet. In such a case, the first and second magnets in each of the magnet pairs may be located at a predetermined distance from each other in the second direction so that the external magnetic field is applied to the entire free layer of at least one magnetoresistive element among the plurality of magnetoresistive elements. In such a case, the magnetization pinned layer, the free layer, and the gap layer may constitute a layered film. The layered film has a width that is a dimension in a direction parallel to the first direction. The width of the layered film may be less than or equal to the distance between the first and second magnets in each of the magnet pairs.

In the magnetic sensor system according to the present invention, the free layer may have magnetic shape anisotropy. In such a case, the bias magnetic field may be attributed to at least the magnetic shape anisotropy.

In the magnetic sensor system according to the present invention, the magnetic sensor may further include a magnetic field amplifier configured to amplify the magnetic field component to be applied to each of the magnetoresistive elements. In such a case, the magnetic field amplifier may include a plurality of soft magnetic layers. The plurality of soft magnetic layers may each be located to overlap at least one magnetoresistive element among the plurality of magnetoresistive elements when seen in a third direction orthogonal to the first and second directions.

In the magnetic sensor system according to the present invention, the gap layer may be a tunnel barrier layer.

In the magnetic sensor system according to the present invention, the magnetic field generator may be a magnetic scale including a plurality of pairs of N and S poles alternately arranged at a predetermined pitch in a predetermined direction. In such a case, the magnetic sensor may generate a detection signal having a correspondence with the resistance of each of the magnetoresistive elements. The detection signal includes an ideal component that changes periodically to trace an ideal sinusoidal curve, and an error component including a plurality of harmonics of the ideal component. The plurality of magnetoresistive elements may be arranged in a predetermined pattern based on the predetermined pitch so that the error component is reduced. In such a case, the plurality of magnetoresistive elements may be arranged to reduce components corresponding to at least seventh and lower, odd-order harmonics included in the error component.

The magnetic sensor system according to the present invention may further include a detection value generation circuit configured to generate a detection value having a correspondence with the position of the magnetic field generator relative to the magnetic sensor based on the resistance of each of the magnetoresistive elements.

A lens position detection device according to the present invention is intended to detect a position of a lens whose position is variable. The lens position detection device includes the magnetic sensor system according to the present invention. The lens is configured to be movable in the first direction. The magnetic sensor and the magnetic field generator are configured so that the strength of the magnetic field component changes as the position of the lens changes.

The lens position detection device according to the present invention may further include a detection value generation circuit configured to generate a detection value having a correspondence with the position of the lens based on the resistance of each of the magnetoresistive elements.

In the magnetic sensor system and the lens position detection device according to the present invention, the plurality of magnetoresistive elements are each configured so that the bias magnetic field in the second direction orthogonal to the first direction is applied to the free layer, and to change in resistance with the strength of the magnetic field component. The maximum strength of the magnetic field component applied to each of the magnetoresistive elements is greater than or equal to 1.2 times the strength of the bias magnetic field. According to the present invention, changes in the detection signal due to the deviation of the distance between the magnetic sensor and the magnetic field generator can thus be suppressed.

Other and further objects, features and advantages of the present invention will appear more fully from the following description.

DETAILED DESCRIPTION OF THE PREFERRED EMBODIMENTS

Figure 1:
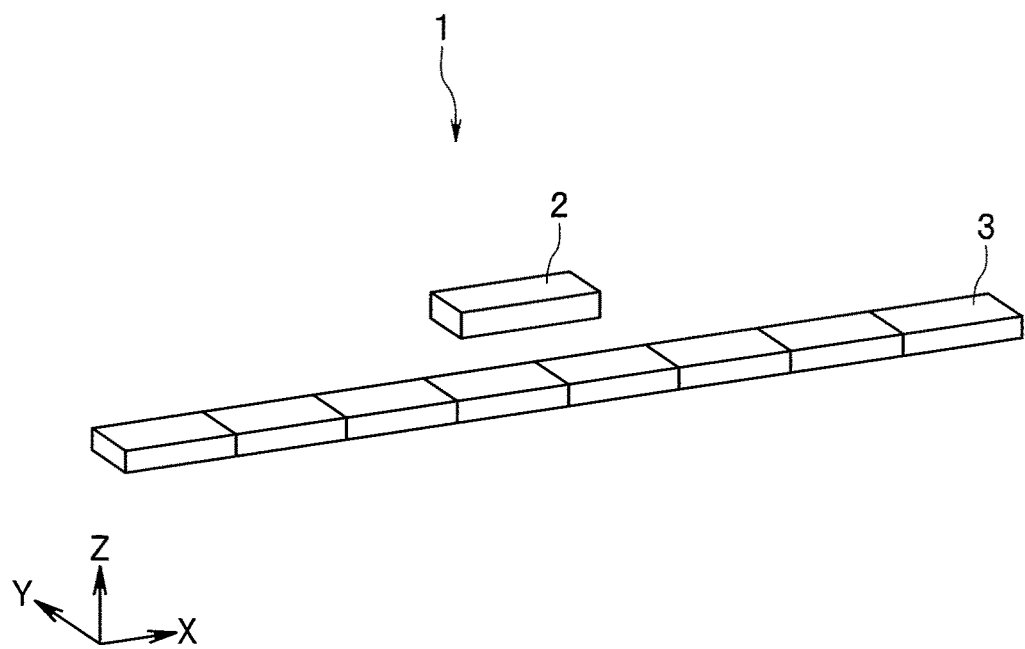
FIG. 1 is a perspective view showing a magnetic sensor system according to an embodiment of the invention.
Figure 2:
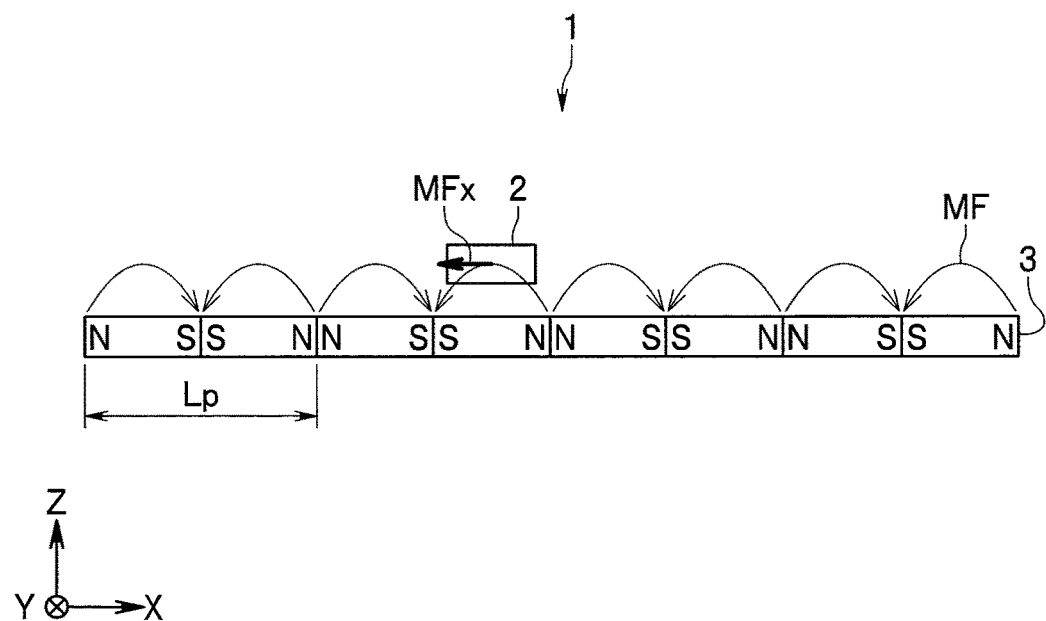
FIG. 2 is a front view showing the magnetic sensor system according to the embodiment of the invention.

An embodiment of the present invention will now be described in detail with reference to the drawings. A schematic configuration of a magnetic sensor system according to the embodiment of the present invention will initially be described with reference to FIGS. 1 and 2. FIG. 1 is a perspective view showing a magnetic sensor system 1. FIG. 2 is a front view showing the magnetic sensor system 1. The magnetic sensor system 1 according to the present embodiment includes a magnetic sensor 2 according to the present embodiment and a magnetic field generator 3.

The magnetic field generator 3 generates a target magnetic field MF that is a magnetic field for the magnetic sensor 2 to detect (magnetic field to be detected). The target magnetic field MF includes a magnetic field component in a direction parallel to an imaginary straight line. The magnetic sensor 2 and the magnetic field generator 3 are configured so that the strength of the magnetic field component of the target magnetic field MF detected by the magnetic sensor 2 changes with a change in the position of the magnetic field generator 3 relative to the magnetic sensor 2. The magnetic sensor 2 detects the target magnetic field MF including the magnetic field component, and generates at least one detection signal corresponding to the strength of the magnetic field component.

The magnetic field generator 3 may be a magnetic scale including a plurality of pairs of N and S poles alternately arranged in a predetermined direction. The magnetic scale may be a magnetic medium, such as a magnetic tape, that is alternately magnetized to a plurality of pairs of N and S poles. The magnetic scale may be a plurality of magnets arranged along the foregoing predetermined direction. The magnetic sensor 2 or the magnetic field generator 3 is movable within a predetermined range along the predetermined direction. As the magnetic sensor 2 or the magnetic field generator 3 moves, the position of the magnetic field generator 3 relative to the magnetic sensor 2 changes. The predetermined direction may be a linear direction or a rotational direction.

In the present embodiment, the magnetic field generator 3 is a linear scale magnetized to a plurality of pairs of N and S poles in a linear direction. The magnetic sensor 2 or the magnetic field generator 3 is movable along the longitudinal direction of the magnetic field generator 3. The plurality of pairs of N and S poles in the magnetic field generator 3 are alternately arranged at a predetermined pitch. As shown in FIG. 2, the distance between two N poles adjoining in the longitudinal direction of the magnetic field generator 3 (the same as the distance between two S poles adjoining in the longitudinal direction of the magnetic field generator 3) will be referred to as one pitch. The size of one pitch will be denoted by the symbol Lp.

Now, we define X, Y, and Z directions as shown in FIGS. 1 and 2. In the present embodiment, a direction parallel to the longitudinal direction of the magnetic field generator 3 will be referred to as an X direction. Two mutually orthogonal directions perpendicular to the X direction are referred to as the Y and Z directions. In FIG. 2, the Y direction is shown as a direction from the near side to the far side of FIG. 2. The opposite directions to the X, Y, and Z directions will be referred to as −X, −Y, and −Z directions, respectively.

The direction parallel to the X direction corresponds to a first direction according to the present invention. The Y direction or −Y direction corresponds to a second direction according to the present invention. The Z direction or −Z direction corresponds to a third direction according to the present invention.

The magnetic sensor 2 is located away from the magnetic field generator 3 in the Z direction. The magnetic sensor 2 is configured to be able to detect the strength of a magnetic field component MFx of the target magnetic field MF at a predetermined position in a direction parallel to the X direction The strength of the magnetic field component MFx changes periodically as the magnetic sensor 2 or the magnetic field generator 3 moves along the direction parallel to the X direction.

For example, the strength of the magnetic field component MFx is expressed in positive values if the direction of the magnetic field component MFx is the X direction, and in negative values if the direction of the magnetic field component MFx is the −X direction. The magnetic sensor 2 can detect whether the strength of the magnetic field component MFx has a positive value or a negative value. The magnetic sensor 2 can thus substantially detect the direction of the magnetic field component MFx (X direction or −X direction). In the following description, the strength of the magnetic field component MFx includes both positive and negative values unless otherwise specified.

Figure 3:
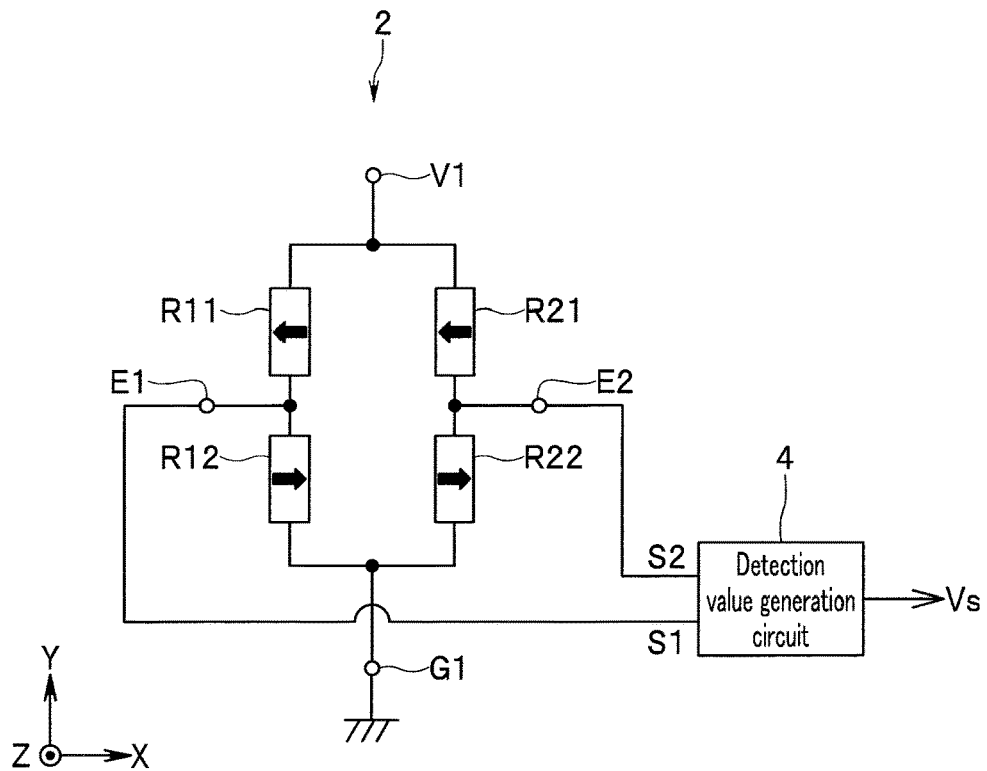
FIG. 3 is a circuit diagram showing the configuration of a magnetic sensor of the embodiment of the invention.

Next, the configuration of the magnetic sensor 2 will be described in detail with reference to FIG. 3. FIG. 3 is a circuit diagram showing the configuration of the magnetic sensor 2. The magnetic sensor 2 includes a first resistor R11, a second resistor R12, a third resistor R21, and a fourth resistor R22 each configured to change in resistance with the strength of the magnetic field component MFx. The first to fourth resistors R11, R12, R21, and R22 each include a plurality of magnetoresistive elements (hereinafter referred to as MR elements) 50.

The magnetic sensor 2 further includes a power supply port V1, a ground port G1, a first output port E1, and a second output port E2. The first resistor R11 is located between the power supply port V1 and the first output port E1. The second resistor R12 is located between the ground port G1 and the first output port E1. The third resistor R21 is located between the power supply port V1 and the second output port E2. The fourth resistor R22 is located between the ground port G1 and the second output port E2. A power supply voltage of predetermined magnitude is applied to the power supply port V1. The ground port G1 is connected to the ground. The magnetic sensor 2 is preferably driven by a constant voltage.

The magnetic sensor 2 generates a signal having a correspondence with the potential at the first output E1 as a first detection signal S1, and generates a signal having a correspondence with the potential at the second output port E2 as a second detection signal S2.

As shown in FIG. 3, the magnetic sensor system 1 further includes a detection value generation circuit 4. The detection value generation circuit 4 generates a detection value Vs having a correspondence with the position of the magnetic field generator 3 relative to the magnetic sensor 2 on the basis of the first and second detection signals S1 and S2.

Figure 4:
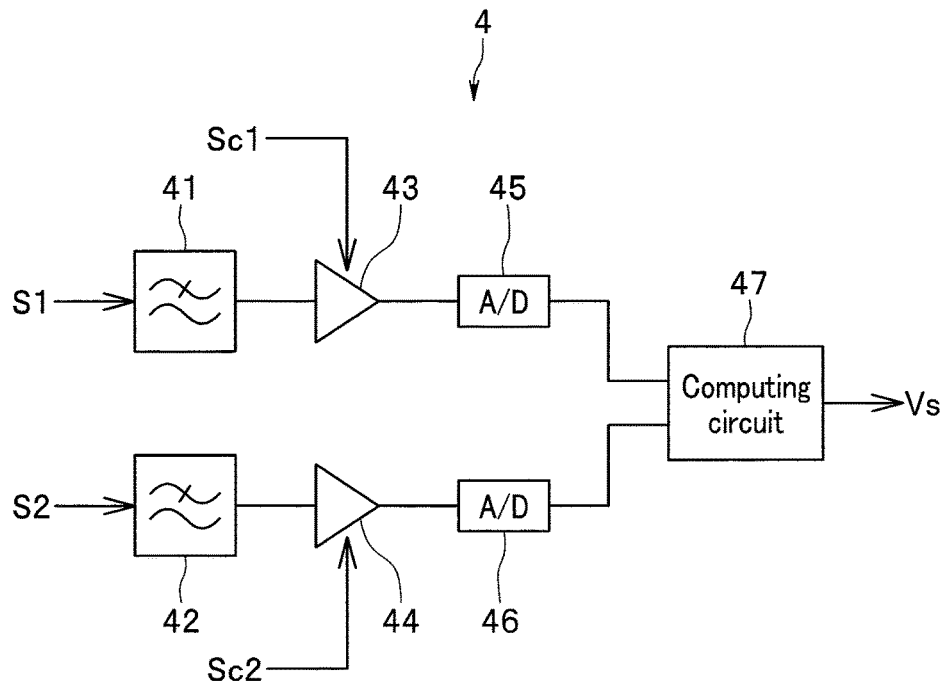
FIG. 4 is a block diagram showing an example configuration of a detection value generation circuit shown in FIG. 3.

An example of the configuration of the detection value generation circuit 4 will be described with reference to FIG. 4. FIG. 4 is a block diagram showing the example of the configuration of the detection value generation circuit 4 shown in FIG. 3. In the example shown in FIG. 4, the detection value generation circuit 4 includes two low-pass filters 41 and 42 for removing harmonic components, two amplifiers 43 and 44 for amplifying signals, two analog-to-digital converters (hereinafter, referred to as A/D converters) 45 and 46 for converting analog signals into digital signals, and a computing circuit 47.

The computing circuit 47 generates the detection value Vs based on the first and second detection signals S1 and S2 digitally converted by the A/D converters 45 and 46. The computing circuit 47 can be implemented by a digital signal processor (DSP), an application-specific integrated circuit (ASIC), or a microcomputer, for example.

The detection value generation circuit 4 may be configured to be able to correct the offset of the first and second detection signals S1 and S2. Specifically, for example, the detection value generation circuit 4 may be configured to be able to add an offset correction signal Sc1 to the first detection signal S1 and an offset correction signal Sc2 to the second detection signal S2. The offset correction signals Sc1 and Sc2 may be analog signals converted by a not-shown digital-to-analog converter, for example.

Figure 5:
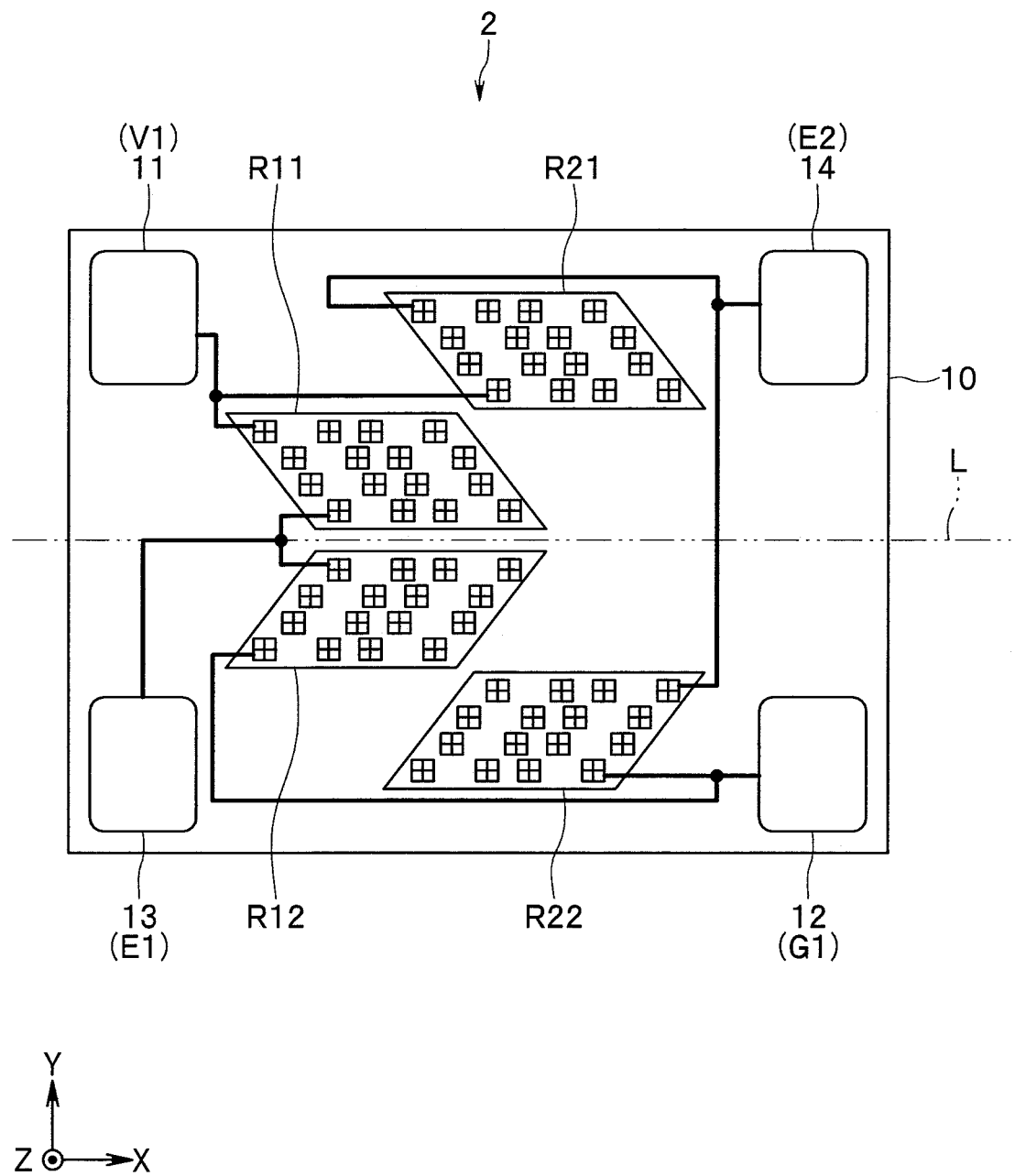
FIG. 5 is a plan view showing the magnetic sensor of the embodiment of the invention.

Next, the magnetic sensor 2 will be described in more detail with reference to FIG. 5. As shown in FIG. 5, the magnetic sensor 2 further includes a substrate 10, and a power supply terminal 11, a ground terminal 12, a first output terminal 13, and a second output terminal 14 that are located on the substrate 10. The power supply terminal 11 constitutes the power supply port V1. The ground terminal 12 constitutes the ground port G1. The first and second output terminals 13 and 14 constitute the first and second output ports E1 and E2, respectively.

The first to fourth resistors R11, R12, R21, and R22 are arranged on the substrate 10 as described below. In the following description, the layout of the first to fourth resistors R11, R12, R21, and R22 will be described with reference to the centers of gravity of the resistors when seen in the Z direction (hereinafter, referred to simply as the centers of gravity). The second resistor R12 is located at the same position as the first resistor R11 is in the X direction. The second resistor R12 is also located in front of the first resistor R11 in the −Y direction.

The third resistor R21 is located at a position Lp/4 (see FIG. 2) away from the first resistor R11 in the X direction. The third resistor R21 is also located anterior to the first resistor R11 in the Y direction.

The fourth resistor R22 is located at a position Lp/4 (see FIG. 2) away from the second resistor R12 in the X direction. The fourth resistor R22 is located at the same position as the third resistor R21 is in the X direction. The fourth resistor R22 is also located anterior to the second resistor R12 in the −Y direction.

In FIG. 5, the symbol L denotes an imaginary straight line parallel to the X direction. In particular, in the present embodiment, the center of gravity of the first resistor R11 and the center of gravity of the second resistor R12 are located at positions symmetrical about the imaginary straight line L. The center of gravity of the third resistor R21 and the center of gravity of the fourth resistor R22 are located at positions symmetrical about the imaginary straight line L.

Next, a configuration of the first to fourth resistors R11, R12, R21, and R22 will be described. Each of the first and second detection signals S1 and S2 contains an ideal component which varies periodically with a predetermined signal period in such a manner as to trace an ideal sinusoidal curve (including sine and cosine waveforms). The size Lp of one pitch shown in FIG. 2 corresponds to one period of the ideal components, i.e., an electrical angle of 360°. Each of the first and second detection signals S1 and S2 contains error components corresponding to harmonics of the ideal component aside from the ideal component. In the present embodiment, the first to fourth resistors R11, R12, R21, and R22 are configured to reduce the error components.

The configuration of the first to fourth resistors R11, R12, R21, and R22 will be described in detail below. Initially, the configuration of the MR elements 50 will be described. The plurality of MR elements 50 are each configured to change in resistance with the strength of the magnetic field component MFx. In the present embodiment, the MR elements 50 are each a spin-valve MR element. The spin-valve MR element includes a magnetization pinned layer having a magnetization whose direction is fixed, a free layer having a magnetization whose direction is variable depending on the magnetic field component MFx, and a gap layer located between the magnetization pinned layer and the free layer. The spin-valve MR element may be a tunneling magnetoresistive (TMR) element or a giant magnetoresistive (GMR) element. In particular, in the present embodiment, the MR element 50 is desirably a TMR element to reduce the dimensions of the magnetic sensor 2. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°.

In FIG. 3, the arrows shown inside the first to fourth resistors R11, R12, R21, and R22 indicate the magnetization directions of the magnetization pinned layers in the respective plurality of MR elements 50 included in the resistors. The magnetization directions of the magnetization pinned layers in the respective plurality of MR elements 50 included in the first and third resistors R11 and R21 are a first magnetization direction. The magnetization directions of the magnetization pinned layers in the respective plurality of MR elements 50 included in the second and fourth resistors R12 and R22 are a second magnetization direction opposite to the first magnetization direction.

In particular, in the present embodiment, the first magnetization direction is the −X direction, and the second magnetization direction is the X direction. In such a case, the magnetization directions of the free layers in the respective plurality of MR elements 50 change within the XY plane with the strength of the magnetic field component MFx. The resistance of each of the plurality of MR elements 50 thus changes with the strength of the magnetic field component MFx. Consequently, the potential at each of the first and second output ports E1 and E2 changes with the strength of the magnetic field component MFx. As described above, the first detection signal S1 has a correspondence with the potential of the first output port E1. The second detection signal S2 has a correspondence with the potential of the second output port E2. The first and second detection signals S1 and S2 thus change with the strength of the magnetic field component MFx.

The potential of the first output port E1 depends on the resistances of the first and second resistors R11 and R12. The resistances of the first and second resistors R11 and R12 depend on the resistances of the respective plurality of MR elements 50 in the first and second resistors R11 and R12. The first detection signal S1 thus has a correspondence with the resistances of the respective plurality of MR elements 50 in the first and second resistors R11 and R12.

Similarly, the potential of the second output port E2 depends on the resistances of the third and fourth resistors R21 and R22. The resistances of the third and fourth resistors R21 and R22 depend on the resistances of the respective plurality of MR elements 50 in the third and fourth resistors R21 and R22. The second detection signal S2 thus has a correspondence with the resistances of the respective plurality of MR elements 50 in the third and fourth resistors R21 and R22.

Next, the layout of the plurality of MR elements 50 in each of the first to fourth resistors R11, R12, R21, and R22 will be described. The plurality of MR elements 50 are arranged in a predetermined pattern based on the size Lp of one pitch so that the error components are reduced. As employed herein, a set of one or more MR elements 50 will be referred to as an element group. The first to fourth resistors R11, R12, R21, and R22 each include a plurality of element groups. In the present embodiment, the positions of the plurality of MR elements 50 are defined in units of element groups. To reduce the error components, the plurality of element groups are located at predetermined distances from each other on the basis of the size Lp of one pitch. In the following description, the layout of the plurality of element groups will be described with reference to predetermined positions of the element groups. An example of the predetermined position of an element group is the center of gravity of the element group when viewed in the Z direction.

Suppose now that n and m are integers that are greater than or equal to 1 and different from each other. For example, to reduce a component corresponding to a $(2n+1)$th harmonic among the error components, a first element group is located at a position $Lp/(4n+2)$ away from a second element group in the X direction. To reduce a component corresponding to a $(2m+1)$th harmonic among the error components, a third element group is located at a position $Lp/(4m+2)$ away from the first element group in the X direction, and a fourth element group is located at a position $Lp/(4m+2)$ away from the second element group in the X direction. In such a manner, to reduce components corresponding to a plurality of harmonics included in the error components, each of a plurality of element groups for reducing a component corresponding to a harmonic is located at a predetermined distance based on the size Lp of one pitch in the X direction from a corresponding one of the plurality of element groups for reducing a component corresponding to another harmonic.

The plurality of element groups (plurality of MR elements 50) are arranged to reduce components corresponding to at least the seventh and lower, odd-order harmonics included in the error components. The number of element groups can be increased to reduce components corresponding to higher-order harmonics. The components to be reduced are preferably ones corresponding to the eleventh or lower, odd-order harmonics, more preferably the thirteenth or lower, odd-order harmonics.

Figure 6:
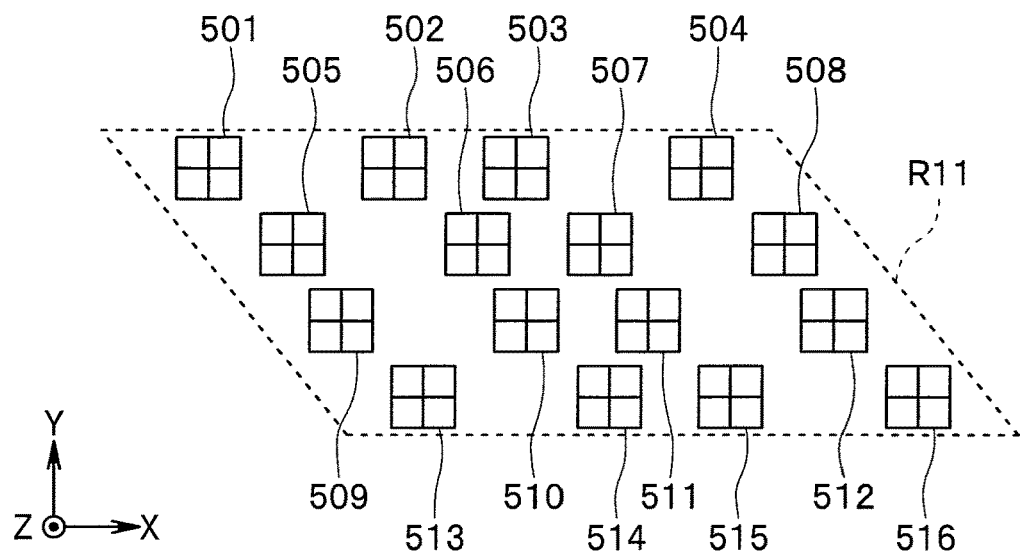
FIG. 6 is a plan view showing a first resistor of the embodiment of the invention.

In the present embodiment, the plurality of element groups (plurality of MR elements 50) in each of the first to fourth resistors R11, R12, R21, and R22 are arranged to reduce the components corresponding to the eleventh and lower, odd-order harmonics included in the error components. FIG. 6 is a plan view showing the first resistor R11. The first resistor R11 includes sixteen element groups 501, 502, 503, 504, 505, 506, 507, 508, 509, 510, 511, 512, 513, 514, 515, and 516. Each of the element groups 501 to 516 is divided into four sections. Each section includes one or more MR elements 50. In other words, each element group includes four or more MR elements 50. The plurality of MR elements 50 may be connected in series within each element group. In such a case, the plurality of element groups may be connected in series. Alternatively, the plurality of MR elements 50 may be connected in series regardless of the element groups.

In the first resistor R11, the element groups 501 to 516 are arranged to reduce the component corresponding to the third harmonic (third-order harmonic) of the ideal component, the component corresponding to the fifth harmonic (fifth-order harmonic) of the ideal component, the component corresponding to the seventh harmonic (seventh-order harmonic) of the ideal component, and the component corresponding to the eleventh harmonic (eleventh-order harmonic) of the ideal component, which are included in the error components. As shown in FIG. 6, the element groups 501 to 504 are arranged along the X direction. The element group 502 is located at a position Lp/10 away from the element group 501 in the X direction. The element group 503 is located at a position Lp/6 away from the element group 501 in the X direction. The element group 504 is located at a position Lp/10+Lp/6 away from the element group 501 in the X direction (at a position Lp/6 away from the element group 502 in the X direction).

As shown in FIG. 6, the element groups 505 to 508 are arranged along the X direction, anterior to the element groups 501 to 504 in the −Y direction. The element group 505 is located at a position Lp/22 away from the element group 501 in the X direction. The element group 506 is located at a position Lp/22+Lp/10 away from the element group 501 in the X direction. The element group 507 is located at a position Lp/22+Lp/6 away from the element group 501 in the X direction. The element group 508 is located at a position Lp/22+Lp/10+Lp/6 away from the element group 501 in the X direction. The element groups 505 to 508 are located at a position Lp/22 away from the element groups 501 to 504 in the X direction, respectively.

As shown in FIG. 6, the element groups 509 to 512 are arranged along the X direction, anterior to the element groups 505 to 508 in the −Y direction. The element group 509 is located at a position Lp/14 away from the element group 501 in the X direction. The element group 510 is located at a position Lp/14+Lp/10 away from the element group 501 in the X direction. The element group 511 is located at a position Lp/14+Lp/6 away from the element group 501 in the X direction. The element group 512 is located at a position Lp/14+Lp/10+Lp/6 away from the element group 501 in the X direction.

As shown in FIG. 6, the element groups 513 to 516 are arranged along the X direction, anterior to the element groups 509 to 512 in the −Y direction. The element group 513 is located at a position Lp/14+Lp/22 away from the element group 501 in the X direction. The element group 514 is located at a position Lp/14+Lp/22+Lp/10 away from the element group 501 in the X direction. The element group 515 is located at a position Lp/14+Lp/22+Lp/6 away from the element group 501 in the X direction. The element group 516 is located at a position Lp/14+Lp/22+Lp/10+Lp/6 away from the element group 501 in the X direction. The element groups 513 to 516 are located at a position Lp/14 away from the element groups 505 to 508 in the X direction, respectively.

In the present embodiment, the configuration of the plurality of element groups in each of the second to fourth resistors R12, R21, and R22 is the same as the configuration of the plurality of element groups in the first resistor R11. More specifically, the second to fourth resistors R12, R21, and R22 each include sixteen element groups 501 to 516 having the configuration shown in FIG. 6. The element groups 501 to 516 of the first resistor R11 and the element groups 501 to 516 of the second resistor R12 are located at positions symmetrical about the imaginary straight line L. The element groups 501 to 516 of the second resistor R12 are located at the same positions as the element groups 501 to 516 of the first resistor R11 are in the X direction, respectively.

The element group 501 of the third resistor R21 is located at a position Lp/4 away from the element group 501 of the first resistor R11 in the X direction. The layout of the element groups 501 to 516 in the third resistor R21 is the same as that of the element groups 501 to 516 in the first resistor R11.

The element groups 501 to 516 of the third resistor R21 and the element groups 501 to 516 of the fourth resistor R22 are located at positions symmetrical about the imaginary straight line L. The element groups 501 to 516 of the fourth resistor R22 are located at the same positions as the element groups 501 to 516 of the third resistor R21 are in the X direction, respectively.

The configuration of the first to fourth resistors R11, R12, R21, and R22 described above makes a phase difference of the ideal component of the second detection signal S2 from the ideal component of the first detection signal S1 an odd number of times 1/4 of a predetermined signal period (the signal period of the ideal component), and reduces the error components of the respective first and second detection signals S1 and S2.

In the light of the production accuracy of the MR elements 50 and other factors, the magnetization directions of the magnetization pinned layers, the positions of the first to fourth resistors R11, R12, R21, and R22, and the positions of the element groups 501 to 516 may be slightly different from the above-described directions and positions.

Figure 7:
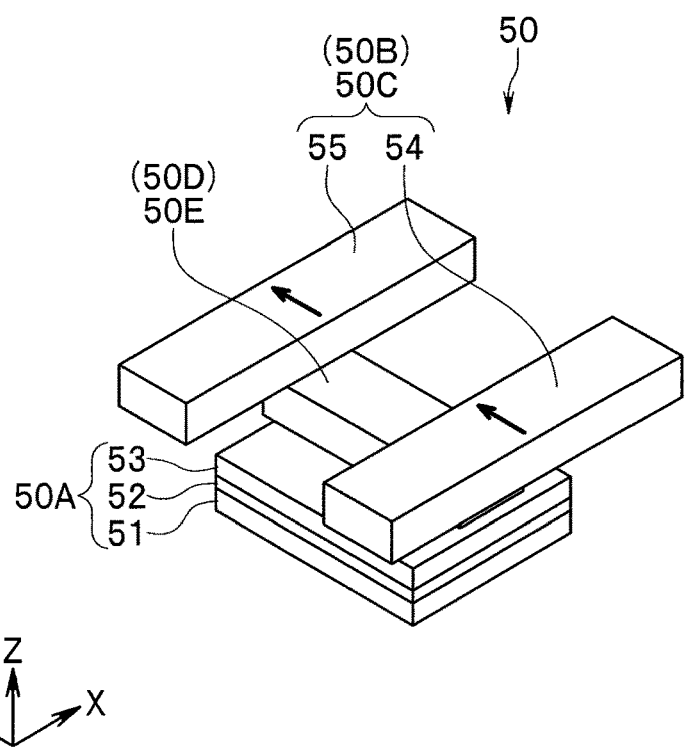
FIG. 7 is a perspective view showing a magnetoresistive element of the embodiment of the invention.
Figure 8:
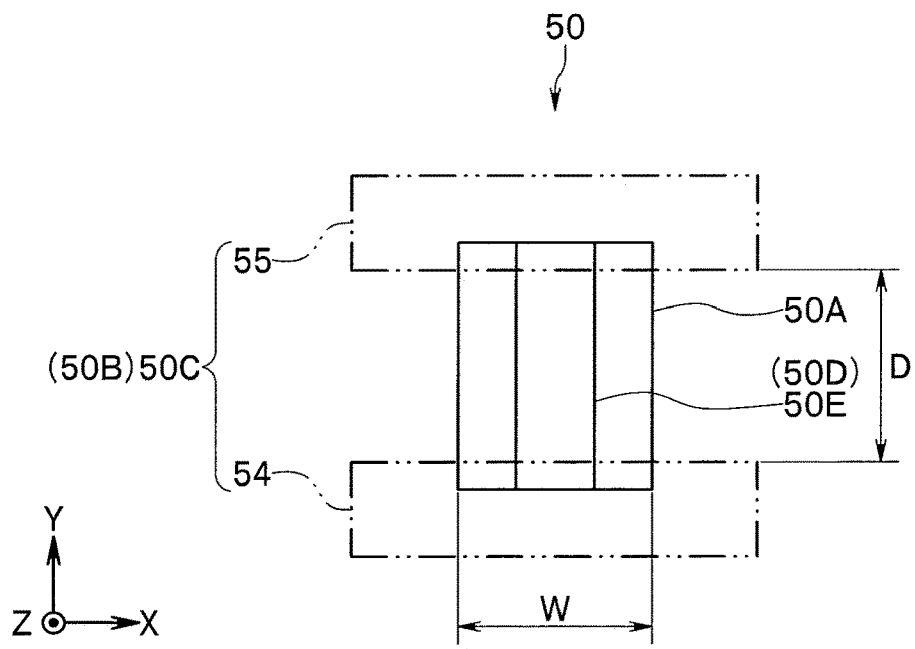
FIG. 8 is a plan view showing the magnetoresistive element of the embodiment of the invention.

Next, a configuration of the MR elements 50 will be described with reference to FIGS. 7 and 8. FIG. 7 is a perspective view showing an MR element 50. FIG. 8 is a plan view showing the MR element 50. The MR element 50 includes a layered film 50A including a magnetization pinned layer 51, a gap layer 52, and a free layer 53 stacked in this order in the Z direction. When seen in the Z direction, the layered film 50A has a rectangular or substantially rectangular planar shape.

The bottom surface of the layered film 50A of the MR element 50 is electrically connected to the bottom surface of the layered film 50A of another MR element 50 by a not-shown lower electrode. The top surface of the layered film 50A of the MR element 50 is electrically connected to the top surface of the layered film 50A of yet another MR element 50 by a not-shown upper electrode. In such a manner, the plurality of MR elements 50 are connected in series. It should be appreciated that the layers 51 to 53 of each layered film 50A may be stacked in the reverse order to that shown in FIG. 7.

The magnetic sensor 2 includes a bias magnetic field generator 50B and a magnetic field amplifier 50D. The bias magnetic field generator 50B generates an external magnetic field to be applied to the free layer 53 in each of the MR elements 50. The magnetic field amplifier 50D amplifies the magnetic field component MFx to be applied to each of the MR elements 50. In particular, in the present embodiment, the bias magnetic field generator 50B includes a plurality of magnet pairs 50C. The magnetic field amplifier 50D includes a plurality of soft magnetic layers 50E.

The plurality of magnet pairs 50C each include a first magnet 54 and a second magnet 55. In each of the magnet pairs 50C, the first and second magnets 54 and 55 are located at a predetermined distance from each other in the Y direction so that the external magnetic field is applied to the entire free layer 53 of at least one of the plurality of MR elements 50. As shown in FIG. 7, the first and second magnets 54 and 55 are located in front of the layered film 50A in the Z direction. As shown in FIGS. 7 and 8, the first magnet 54 is located near the end of the layered film 50A in the −Y direction, and the second magnet 55 is located near the end of the layered film 50A in the Y direction. The first and second magnets 54 and 55 each have a planar shape that extends in the X direction (when seen in the Z direction). In FIG. 7, the arrows in the first and second magnets 54 and 55 indicate their respective magnetization directions. The direction of the external magnetic field applied to the free layer 53 by the first and second magnets 54 and 55 is the Y direction.

In FIG. 8, the first magnet 54, when seen in the Z direction, overlaps a part of the layered film 50A including the end in the −Y direction. However, the first magnet 54 may be located in front of the layered film 50A in the −Y direction. Similarly, the second magnet 55, when seen in the Z direction, overlaps a part of the layered film 50A including the end in the Y direction. However, the second magnet 55 may be located in front of the layered film 50A in the Y direction.

Each of the soft magnetic layers 50E is located to overlap at least one of the plurality of MR elements 50 when seen in the Z direction. In the example shown in FIG. 7, the soft magnetic layer 50E is located to overlap an MR element 50. Moreover, the soft magnetic layer 50E is located between the layered film 50A and the magnet pair 50C (first and second magnets 54 and 55). The soft magnetic layer 50E has a planar shape that extends in the Y direction. The soft magnetic layer 50E may overlap each of the first and second magnets 54 and 55 when seen in the Z direction.

Figure 9:
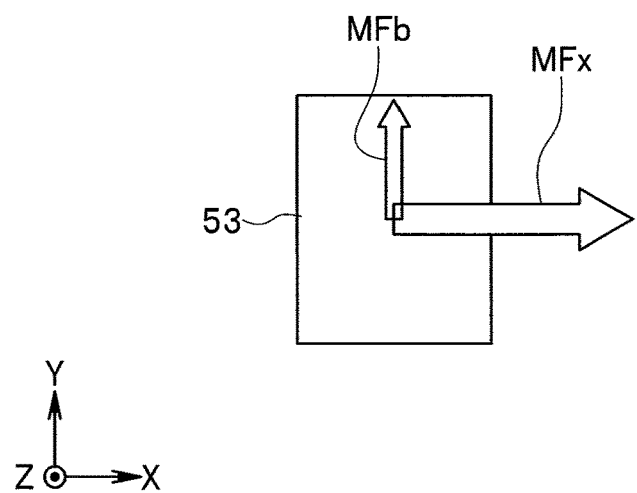
FIG. 9 is an explanatory diagram for describing a bias magnetic field applied to a free layer of the embodiment of the invention.

Next, the bias magnetic field applied to the free layer 53 in each of the MR elements 50 will be described with reference to FIG. 9. FIG. 9 is an explanatory diagram describing a bias magnetic field MFb applied to the free layer 53. In the present embodiment, the following first and second requirements are set for the bias magnetic field MFb. The first requirement is that each of the MR elements 50 be configured to change in resistance with the strength of the magnetic field component MFx and also to apply a bias magnetic field MFb in the Y direction or −Y direction to the free layer 53. The second requirement is that the maximum strength of the magnetic field component MFx applied to each of the MR elements 50 be greater than or equal to 1.2 times the strength of the bias magnetic field MFb.

The first requirement defines the direction of the bias magnetic field MFb as well as the strength of the bias magnetic field MFb. More specifically, if the bias magnetic field MFb is too high, the resistance of the MR element 50 does not change with the strength of the magnetic field component MFx. On the other hand, if the bias magnetic field MFb is too low, the resistance of the MR element 50 is saturated within the range of strength of the magnetic field component MFx. If the resistance of the MR element 50 is saturated, the resistance of the MR element 50 does not change with the strength of the magnetic field component MFx. The first requirement thus defines that the strength of the bias magnetic field MFb falls within the range of strength where the resistance changes with the strength of the magnetic field component MFx.

The second requirement is, in other words, that the strength of the bias magnetic field MFb is defined to be less than or equal to 0.83 times the maximum strength of the magnetic field component MFx applied to the MR element 50. In short, the first and second requirements define that the strength of the bias magnetic field MFb falls within the range of strength where the resistance changes with the strength of the magnetic field component MFx, and is less than or equal to 0.83 times the maximum strength of the magnetic field component MFx applied to the MR element 50 within the range of strength.

The bias magnetic field MFb is attributed to either an external magnetic field applied to the free layer 53 from outside or an anisotropic magnetic field due to anisotropy of the free layer 53, or both. In particular, in the present embodiment, the external magnetic field generated by the bias magnetic field generator 50B (magnet pair 50C) is applied to the free layer 53 as the foregoing external magnetic field. In other words, the external magnetic field acts as the bias magnetic field MFb. As described above, the direction of the external magnetic field is the Y direction. If the bias magnetic field MFb is attributed to the external magnetic field, the direction of the bias magnetic field MFb is therefore also the Y direction.

The bias magnetic field MFb applied to the free layer 53 may be one attributed to the anisotropic magnetic field in addition to or instead of the external magnetic field. For example, the free layer 53 may have magnetic shape anisotropy with a direction of an easy axis of magnetization parallel to the Y direction. In such a case, the anisotropic magnetic field attributed to the magnetic shape anisotropy acts as the bias magnetic field MFb.

As shown in FIG. 8, the distance between the first and second magnets 54 and 55 will be denoted by the symbol D. The width, or the dimension in the direction parallel to the X direction, of the layered film 50A will be denoted by the symbol W. The width W is less than or equal to the dimension of the layered film 50A in the Y direction. The width W is desirably less than or equal to the distance D. This makes both the external magnetic field and the anisotropic magnetic field act as the bias magnetic field MFb.

The direction of the external magnetic field may be oblique to the Y direction or −Y direction and the direction of the easy axis of magnetization may be oblique to a direction parallel to the Y direction as long as the bias magnetic field MFb in the Y direction or −Y direction is applied to the free layer 53. The anisotropic magnetic field may be one attributed to magnetic uniaxial anisotropy other than magnetic shape anisotropy, such as magnetocrystalline anisotropy.

Next, a method for generating the detection value Vs of the present embodiment will be described. For example, the detection value generation circuit 4 generates the detection value Vs in the following manner. The computing circuit 47 of the detection value generation circuit 4 determines an initial detection value in the range of 0° or more and less than 360° by calculating the arctangent of the ratio of the second detection signal S2 to the first detection signal S1, i.e., atan (S2/S1). The initial detection value may be the value of the arctangent itself. The initial detection value may be a value obtained by adding a predetermined angle to the value of the arctangent.

If the foregoing value of the arctangent is 0°, the position of an S pole of the magnetic field generator 3 and the position of the element group 501 in each of the first and second resistors R11 and R12 coincide in the X direction. If the foregoing value of the arctangent is 180°, the position of an N pole of the magnetic field generator 3 and the position of the element group 501 in each of the first and second resistors R11 and R12 coincide in the X direction. The initial detection value thus has a correspondence with the position of the magnetic field generator 3 relative to the magnetic sensor 2 (hereinafter, also referred to as relative position) within one pitch.

The computing circuit 47 of the detection value generation circuit 4 also counts the number of rotations of the electrical angle from a reference position, with one period of the initial detection value as an electrical angle of 360°. One rotation of the electrical angle corresponds to the amount of movement of the relative position as much as one pitch. The computing circuit 47 of the detection value generation circuit 4 generates the detection value Vs having a correspondence with the relative position on the basis of the initial detection value and the number of rotations of the electrical angle.

As described above, the first and second detection signals S1 and S2 have a correspondence with the resistances of the respective plurality of MR elements 50. The computing circuit 47 of the detection value generation circuit 4 can thus be said to generate the detection value Vs based on the resistances of the respective plurality of MR elements 50 in the first to fourth resistors R11, R12, R21, and R22.

Next, the operation and effects of the magnetic sensor system 1 and the magnetic sensor 2 according to the present embodiment will be described. In the present embodiment, the MR elements 50 are configured so that the bias magnetic field MFb is applied to the free layers 53. As described above, in the present embodiment, the first and second requirements are set for the bias magnetic field MFb. According to the present embodiment, changes in the first and second detection signals S1 and S2 due to a deviation of the distance between the magnetic sensor 2 and the magnetic field generator 3 can be suppressed by satisfying the first and second requirements. A detailed description thereof will now be given.

Initially, a relationship between the impacts of the distance between the magnetic sensor 2 and the magnetic field generator 3 on the magnetic field component MFx and the first and second detection signals S1 and S2 will be described. As shown in FIGS. 1 and 2, the magnetic sensor 2 is located at a predetermined distance from the magnetic field generator 3. The distance between the magnetic sensor 2 and the magnetic field generator 3 will hereinafter be referred to as a gap, and denoted by the symbol AG.

Figure 10:
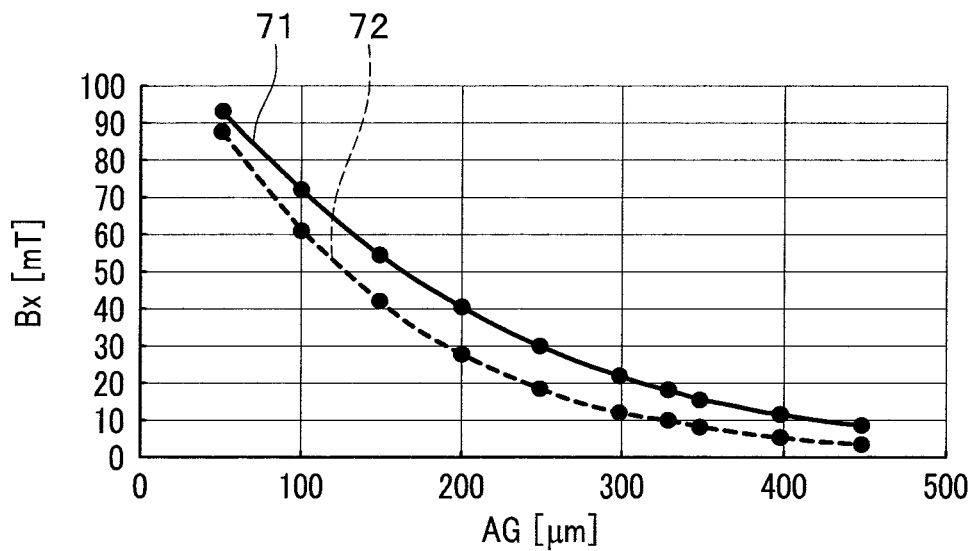
FIG. 10 is a characteristic chart showing an example of a relationship between a gap and a magnetic field component of the embodiment of the invention.
Figure 11:
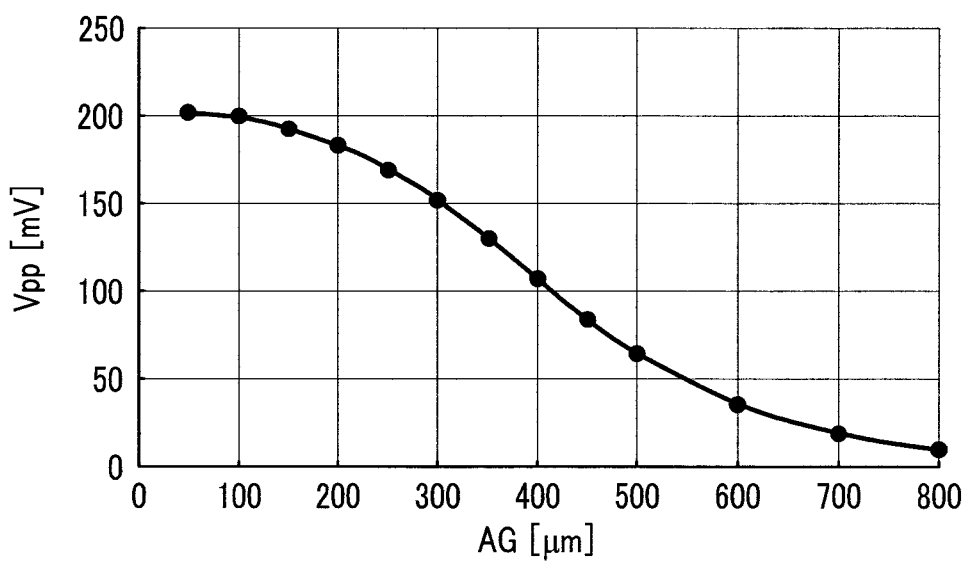
FIG. 11 is a characteristic chart showing an example of a relationship between a gap and a detection signal according to the embodiment of the invention.

FIG. 10 is a characteristic chart showing an example of a relationship between the gap AG and the magnetic field component MFx. FIG. 11 is a characteristic chart showing an example of a relationship between the gap AG and the detection signals. In FIGS. 10 and 11, the horizontal axis indicates the gap AG In FIG. 10, the vertical axis indicates the magnitude of a magnetic flux density Bx corresponding to the maximum strength of the magnetic field component MFx detectable by the magnetic sensor 2. In FIG. 11, the vertical axis indicates a peak-to-peak value Vpp of the first detection signal S1 when the position of the magnetic field generator 3 relative to the magnetic sensor 2 is changed. In FIG. 10, the curve denoted by the reference numeral 71 represents the magnetic flux density Bx in using the magnetic field generator 3 where the size Lp of one pitch is set to 1000 μm. The curve denoted by the reference numeral 72 represents the magnetic flux density Bx in using the magnetic field generator 3 where the size Lp of one pitch is set to 750 μm.

As can be seen from FIG. 10, the magnetic flux density Bx, i.e., the strength of the magnetic field component MFx decreases as the gap AG increases. As can be seen from FIG. 11, the peak-to-peak value Vpp, i.e., the magnitude of the first detection signal S1 decreases as the gap AG increases. Although not shown in the chart, the relationship between the gap AG and the first detection signal S1 also applies to that between the gap AG and the second detection signal S2. The second detection signal S2 therefore also decreases as the gap AG increases.

Figure 12:
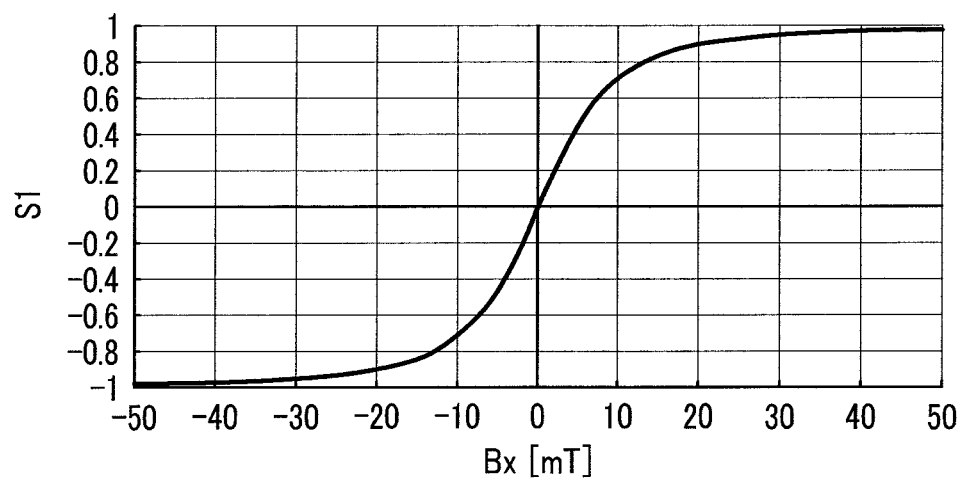
FIG. 12 is a characteristic chart showing an example of a relationship between a magnetic field component and a detection signal according to the embodiment of the invention.

FIG. 12 is a characteristic chart showing an example of a relationship between the magnetic field component MFx and the detection signals. In FIG. 12, the horizontal axis indicates the magnitude of the magnetic flux density Bx corresponding to the magnetic field component MFx, and the vertical axis the magnitude of the first detection signal S1. In FIG. 12, the magnetic flux density Bx when the direction of the magnetic field component MFx is the X direction is expressed in positive values, and the magnetic flux density Bx when the direction of the magnetic field component MFx is the –X direction in negative values. In FIG. 12, the first detection signal S1 is normalized so that the maximum value of the first detection signal S1 is 1 and the minimum value of the first detection signal S1 is –1.

As can be seen from FIG. 12, if the strength of the magnetic field component MFx (magnetic flux density Bx) changes within a relatively narrow range including 0 (for example, ±7 mT), the first detection signal S1 changes greatly with a change in the strength of the magnetic field component MFx. The maximum value of the first detection signal S1 therefore also changes greatly with a change in the maximum strength of the magnetic field component MFx. In such a case, if the gap AG deviates to shift the maximum strength of the magnetic field component MFx, the maximum value of the first detection signal S1 changes greatly.

By contrast, in the present embodiment, the second requirement defines that the maximum strength of the magnetic field component MFx applied to each of the MR elements 50 is greater than or equal to 1.2 times the strength of the bias magnetic field MFb. In the present embodiment, the range of changes in the first detection signal S1 is thereby increased so that the maximum value of the first detection signal S1 does not change greatly with a change in the maximum strength of the magnetic field component MFx. According to the present embodiment, changes in the maximum value of the first detection signal S1 when the gap AG deviates to shift the maximum strength of the magnetic field component MFx can thus be suppressed.

The foregoing description of the first detection signal S1 also applies to the second detection signal S2. According to the present embodiment, like the first detection signal S1, changes in the maximum value of the second detection signal S2 when the gap AG deviates to shift the maximum strength of the magnetic field component MFx can be suppressed.

Next, a relationship between the maximum strength of the magnetic field component MFx and the strength of the bias magnetic field MFb will be described in detail with reference to the results of first and second simulations. In the following description, the strength of the magnetic field component MFx refers to the maximum strength of the magnetic field component MFx unless otherwise specified.

Initially, the first simulation will be described. The first simulation used a model of the magnetic sensor system 1. The size Lp of one pitch of the magnetic field generator 3 was set to 1000 μm.

In the first simulation, a relationship between the gap AG and the peak-to-peak value Vpp of the first detection signal S1 was determined by changing the gap AG In the first simulation, a magnetic flux density Bb corresponding to the strength of the bias magnetic field MFb was changed to 0.1 mT, 2 mT, 5 mT, 10 mT, and 15 mT. The relationship between the gap AG and the peak-to-peak value Vpp of the first detection signal S1 was determined for each strength of the bias magnetic field MFb (each value of the magnetic flux density Bb).

In the first simulation, the rate of change of the first detection signal S1 when the gap AG changed (hereinafter, referred to as an output change rate) was also determined. Here, the peak-to-peak value Vpp for a first value of the gap AG will be referred to as a first peak-to-peak value. The peak-to-peak value Vpp for a second value of the gap AG 50 μm greater than the first value will be referred to as a second peak-to-peak value. In the first simulation, a difference between the first and second peak-to-peak values, divided by the first peak-to-peak value was assumed as the output change rate for the first value of the gap AG A relationship between the strength of the magnetic field component MFx and the output change rate was then determined from the relationship between the gap AG and the strength of the magnetic field component MFx. The relationship between the strength of the magnetic field component MFx and the output change rate was determined for each strength of the bias magnetic field MFb (each value of the magnetic flux density Bb).

Figure 13:
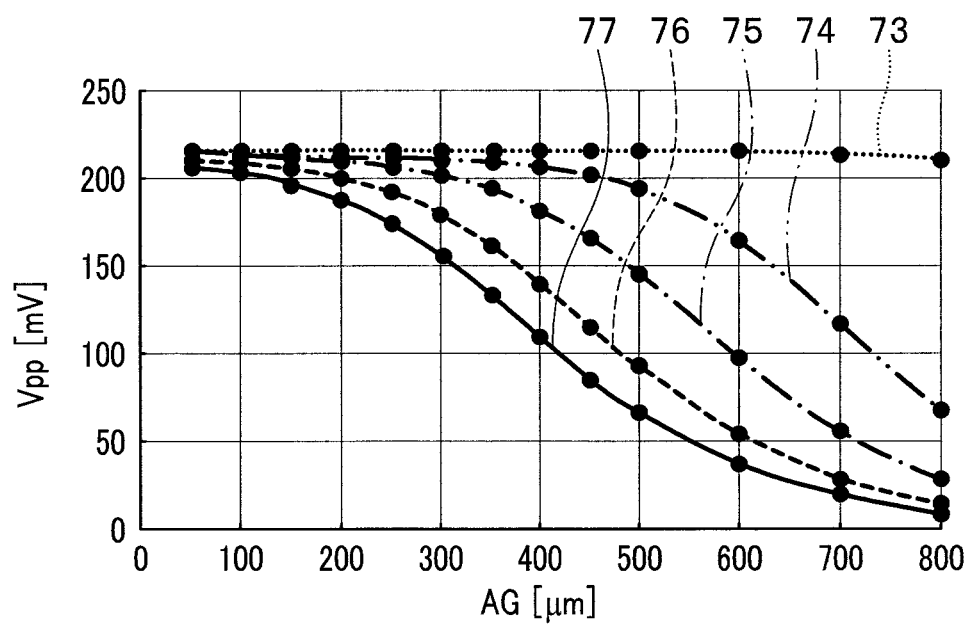
FIG. 13 is a characteristic chart showing a relationship between the gap and a peak-to-peak value of a first detection signal, determined by a first simulation.

FIG. 13 is a characteristic chart showing the relationship between the gap AG and the peak-to-peak value Vpp of the first detection signal S1. In FIG. 13, the horizontal axis indicates the gap AG and the vertical axis the peak-to-peak value Vpp. In FIG. 13, the curve denoted by the reference numeral 73 represents the peak-to-peak value Vpp for a magnetic flux density Bb of 0.1 mT. The curve denoted by the reference numeral 74 represents the peak-to-peak value Vpp for a magnetic flux density Bb of 2 mT. The curve denoted by the reference numeral 75 represents the peak-to-peak value Vpp for a magnetic flux density Bb of 5 mT. The curve denoted by the reference numeral 76 represents the peak-to-peak value Vpp for a magnetic flux density Bb of 10 mT. The curve denoted by the reference numeral 77 represents the peak-to-peak value Vpp for a magnetic flux density Bb of 15 mT.

From FIG. 13, it can be seen that the peak-to-peak value Vpp, i.e., the magnitude of the first detection signal S1 decreases as the gap AG increases, except for the magnetic flux density Bb of 0.1 mT. FIG. 13 also shows that the amount of change in the first detection signal S1 with a change in the gap AG decreases as the strength of the bias magnetic field MFb (magnetic flux density Bb) decreases.

Figure 14:
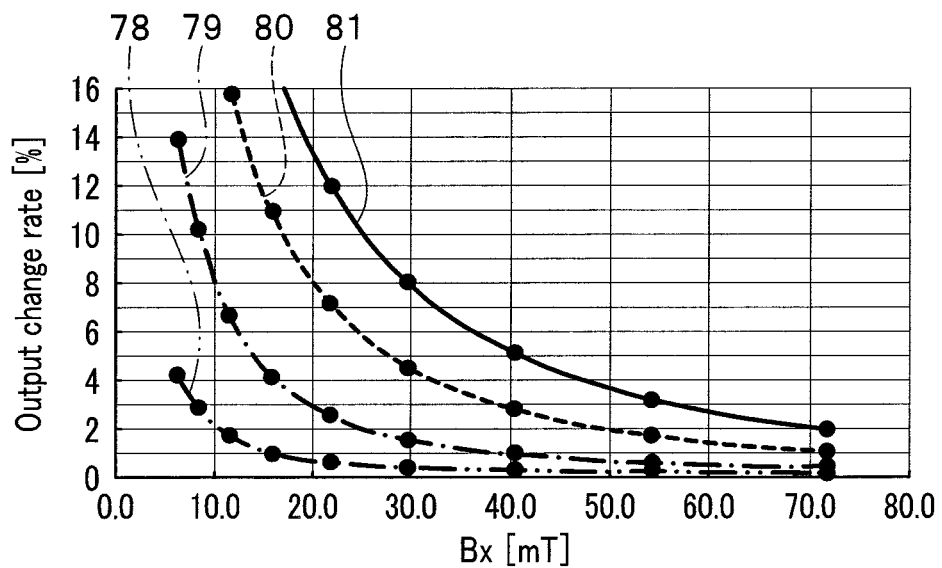
FIG. 14 is a characteristic chart showing a relationship between the strength of the magnetic field component and an output change rate, determined by the first simulation.

FIG. 14 is a characteristic chart showing the relationship between the strength of the magnetic field component MFx and the output change rate. In FIG. 14, the horizontal axis indicates the magnitude of the magnetic flux density Bx corresponding to the strength of the magnetic field component MFx, and the vertical axis the output change rate. In FIG. 14, the curve denoted by the reference numeral 78 represents the output change rate for a magnetic flux density Bb of 2 mT. The curve denoted by the reference numeral 79 represents the output change rate for a magnetic flux density Bb of 5 mT. The curve denoted by the reference numeral 80 represents the output change rate for a magnetic flux density Bb of 10 mT. The curve denoted by the reference numeral 81 represents the output change rate for a magnetic flux density Bb of 15 mT.

From FIG. 14, it can be seen that the output change rate decreases as the strength of the magnetic field component MFx (magnetic flux density Bx) increases. FIG. 14 also shows that the output change rate decreases as the strength of the bias magnetic field MFb (magnetic flux density Bb) decreases.

From the results of the first simulation, it can be seen that the output change rate can be reduced by increasing the strength of the magnetic field component MFx or reducing the strength of the bias magnetic field MFb. The upper limit value of the output change rate at which the change in the detection signal can be determined to be small is 15%, for example. From FIG. 14, the magnetic flux density Bx at which the output change rate is 15% is 6 mT for a magnetic flux density Bb of 5 mT, 12 mT for a magnetic flux density Bb of 10 mT, and 18 mT for a magnetic flux density Bb of 15 mT. That is, the output change rate is 15% when the magnetic flux density Bx is 1.2 times the magnetic flux density Bb.

The magnetic flux density Bx corresponds to the maximum strength of the magnetic field component MFx applied to each of the MR elements 50. The magnetic flux density Bb corresponds to the strength of the bias magnetic field MFb. In the present embodiment, the maximum strength of the magnetic field component MFx applied to each of the MR elements 50 is set to greater than or equal to 1.2 times the strength of the bias magnetic field MFb. According to the present embodiment, the output change rate can thus be reduced to less than or equal to 15%.

The output change rate is preferably less than or equal to 10%, more preferably less than or equal to 8%. From FIG. 14, the magnetic flux density Bx at which the output change rate is 10% is 8.5 mT for a magnetic flux density Bb of 5 mT, 17 mT for a magnetic flux density Bb of 10 mT, and 25.5 mT for a magnetic flux density Bb of 15 mT. That is, the output change rate is 10% when the magnetic flux density Bx is 1.7 times the magnetic flux density Bb.

From FIG. 14, the magnetic flux density Bx at which the output change rate is 8% is 10 mT for a magnetic flux density Bb of 5 mT, 20 mT for a magnetic flux density Bb of 10 mT, and 30 mT for a magnetic flux density Bb of 15 mT. That is, the output change rate is 8% when the magnetic flux density Bx is 2 times the magnetic flux density Bb.

As described above, the maximum strength of the magnetic field component MFx applied to each of the MR elements 50 is preferably greater than or equal to 1.7 times the strength of the bias magnetic field MFb, more preferably greater than or equal to twice.

Next, the second simulation will be described. Like the first simulation, the second simulation used a model of the magnetic sensor system 1. The magnetic flux density Bb corresponding to the bias magnetic field MFb was set to 5 mT.

The ratio of the maximum strength of the magnetic field component MFx applied to each of the MR elements 50 to the strength of the bias magnetic field MFb will be referred to as a magnetic field ratio. In the second simulation, the effects of the magnetic field ratio on the detection signals and the detection value Vs were examined by changing the strength of the magnetic field component MFx. Specifically, a component corresponding to the thirteenth harmonic (thirteenth-order harmonic) of the ideal component included in the error components of the first detection signal S1 was determined to determine a relationship between the strength of the magnetic field component MFx and the thirteenth harmonic.

In the second simulation, the foregoing initial detection value was also determined from the first and second detection signals S1 and S2. Moreover, an ideal angle equivalent to the initial detection value was determined from the ideal components of the respective first and second detection signals S1 and S2, and a difference between the initial detection value and the ideal angle (hereinafter, referred to as an angular error) was determined. A relationship between the magnetic field ratio and the angular error was then determined.

Figure 15:
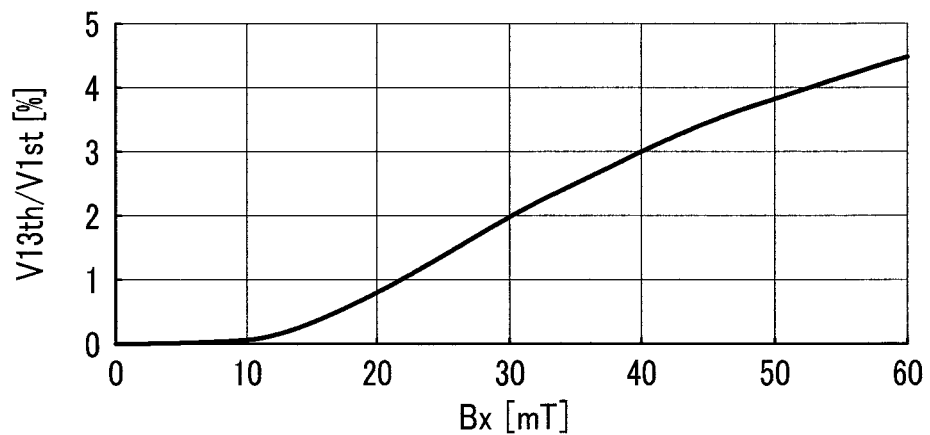
FIG. 15 is a characteristic chart showing a relationship between the strength of the magnetic field component and a thirteenth harmonic, determined by a second simulation.

FIG. 15 is a characteristic chart showing the relationship between the strength of the magnetic field component MFx and the thirteenth harmonic. In FIG. 15, the horizontal axis indicates the magnetic flux density Bx corresponding to the strength of the magnetic field component MFx. In FIG. 15, the vertical axis indicates a ratio V13th/V1st of the amplitude of the thirteenth harmonic to that of the ideal component. From FIG. 15, it can be seen that the ratio V13th/V1st increases as the magnetic flux density Bx increases. This result shows that the amplitude of the thirteenth harmonic increases as the magnetic field ratio increases.

The magnetic sensor 2 of the magnetic sensor system 1 includes the plurality of MR elements 50 arranged to reduce the components corresponding to the eleventh and lower, odd-order harmonics included in the error components. In other words, the magnetic sensor 2 is not configured to reduce components corresponding to the thirteenth and higher harmonics included in the error components. As shown in FIG. 15, the amplitude of the thirteenth harmonic therefore increases as the magnetic flux density Bx increases. The component corresponding to the thirteenth harmonic included in the error components thus increases as the magnetic field ratio increases.

Figure 16:
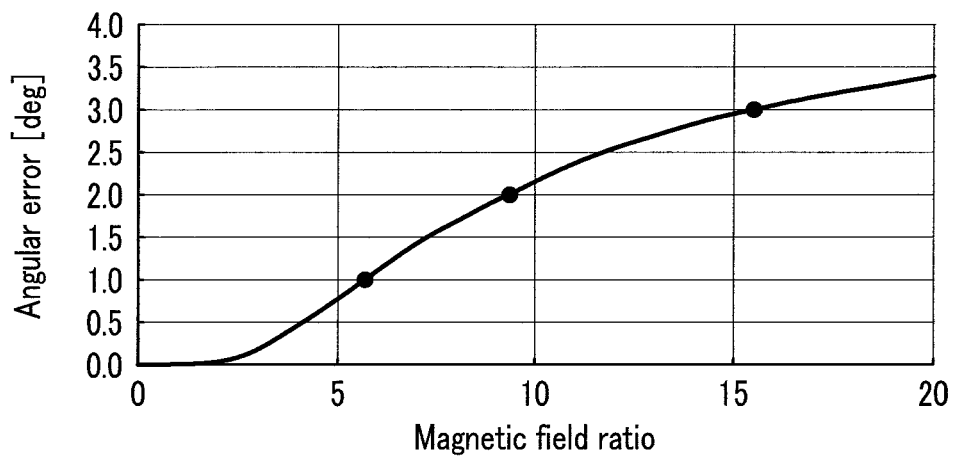
FIG. 16 is a characteristic chart showing a relationship between a magnetic field ratio and an angular error, determined by a second simulation.

FIG. 16 is a characteristic chart showing the relationship between the magnetic field ratio and the angular error. In FIG. 16, the horizontal axis indicates the magnetic field ratio, and the vertical axis the angular error. From FIG. 16, it can be seen that the angular error increases as the magnetic field ratio increases. The reason is that as the magnetic field ratio increases, the component equivalent to the thirteenth harmonic among the error components increases as described above.

The greater the angular error, the greater the error in the detection value Vs. From FIG. 16, it can thus be seen that the error in the detection value Vs increases as the magnetic field ratio increases.

The upper limit value of the angular error at which the error in the detection value Vs is allowable is 3°, for example. From FIG. 16, the magnetic field ratio at which the angular error is 3° is 15.6. The magnetic field ratio corresponds to the ratio of the maximum strength of the magnetic field component MFx applied to each of the MR elements 50 to the strength of the bias magnetic field MFb. The angular error can thus be reduced to less than or equal to 3° by setting the maximum strength of the magnetic field component MFx applied to each of the MR elements 50 to less than or equal to 15.6 times the strength of the bias magnetic field MFb.

The angular error is preferably less than or equal to 2°, more preferably less than or equal to 1°. From FIG. 16, the magnetic field ratio at which the angular error is 2° is 9.2, and the magnetic field ratio at which the angular error is 1° is 5.6. The maximum strength of the magnetic field component MFx applied to each of the MR elements 50 is thus preferably less than or equal to 9.2 times the strength of the bias magnetic field MFb, more preferably less than or equal to 5.6 times.

In the present embodiment, the magnetic sensor system 1 includes the detection value generation circuit 4. If the magnetic sensor 2 of the present embodiment is used, the detection value generation circuit 4 or the computing circuit 47 can correct the first and second detection signals S1 and S2 or the detection value Vs to reduce the error due to the angular error. The correction of the first and second detection signals S1 and S2 or the detection value Vs is facilitated by setting the magnetic field ratio so that the angular error is somewhat small as described above.

Next, the strength of the bias magnetic field MFb will be described with reference to the result of a third simulation. Like the first and second simulations, the third simulation used a model of the magnetic sensor system 1.

In the third simulation, a relationship between the magnetic field component MFx and a detection signal was determined while changing the strength of the bias magnetic field MFb. In the third simulation, the first detection signal S1 was used as the detection signals. In the third simulation, a magnetic flux density Bb corresponding to the strength of the bias magnetic field MFb was changed to 0 mT, 2 mT, 5 mT, 8 mT, 10 mT, 15 mT, and 20 mT. The relationship between the magnetic field component MFx and the first detection signal S1 was determined for each strength of the bias magnetic field MFb (each value of the magnetic flux density Bb).

Figure 17:
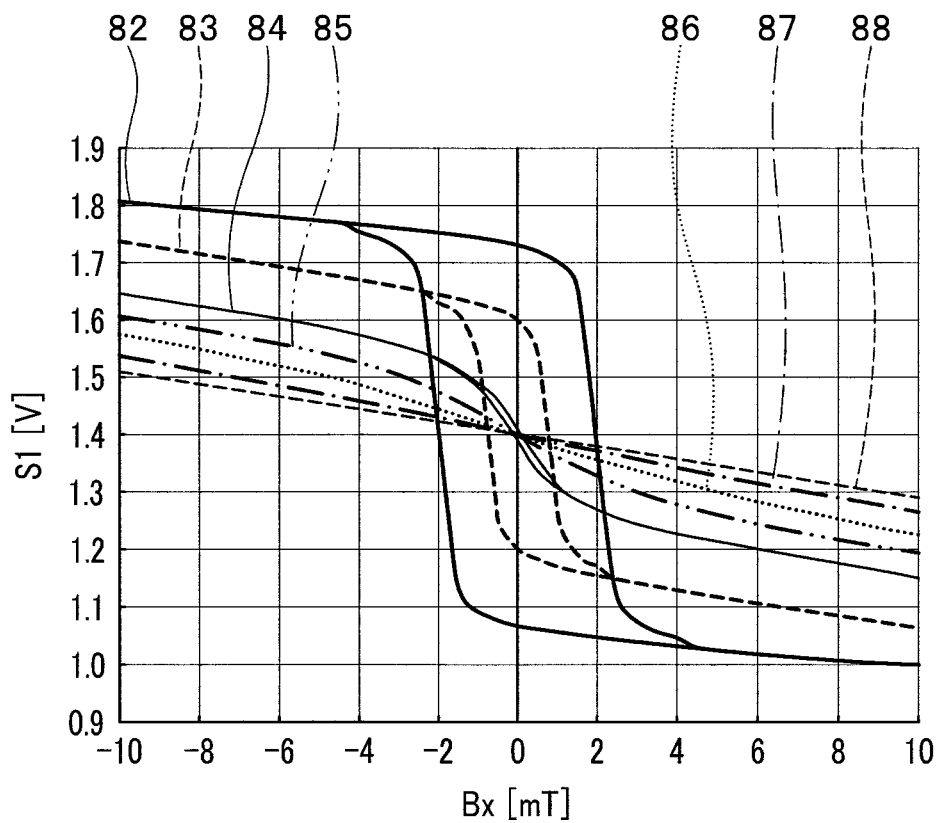
FIG. 17 is a characteristic chart showing a relationship between a magnetic field component and a first detection signal, determined by a third simulation.

FIG. 17 is a characteristic chart showing the relationship between the magnetic field component MFx and the first detection signal S1. In FIG. 17, the horizontal axis indicates the magnetic flux density Bx corresponding to the strength of the magnetic field component MFx, and the vertical axis the first detection signal S1. In FIG. 17, the curve denoted by the reference numeral 82 represents the first detection signal S1 for a magnetic flux density Bb of 0 mT. The curve denoted by the reference numeral 83 represents the first detection signal S1 for a magnetic flux density Bb of 2 mT. The curve denoted by the reference numeral 84 represents the first detection signal S1 for a magnetic flux density Bb of 5 mT. The curve denoted by the reference numeral 85 represents the first detection signal S1 for a magnetic flux density Bb of 8 mT. The curve denoted by the reference numeral 86 represents the first detection signal S1 for a magnetic flux density Bb of 10 mT. The curve denoted by the reference numeral 87 represents the first detection signal S1 for a magnetic flux density Bb of 15 mT. The curve denoted by the reference numeral 88 represents the first detection signal S1 for a magnetic flux density Bb of 20 mT.

In the example shown in FIG. 17, the first detection signal S1 for a magnetic flux density Bx of 0 (the offset of the first detection signal S1) is ideally 1.4 V. The value of the magnetic flux density Bx at which the first detection signal S1 reaches 1.4 V when the magnetic flux density Bx is increased from a negative value will be referred to as a first value. The value of the magnetic flux density Bx at which the first detection signal S1 reaches 1.4 V when the magnetic flux density Bx is decreased from a positive value will be referred to as a second value. The absolute value of a difference between the first and second values will be referred to as a hysteresis Hys.

Figure 18:
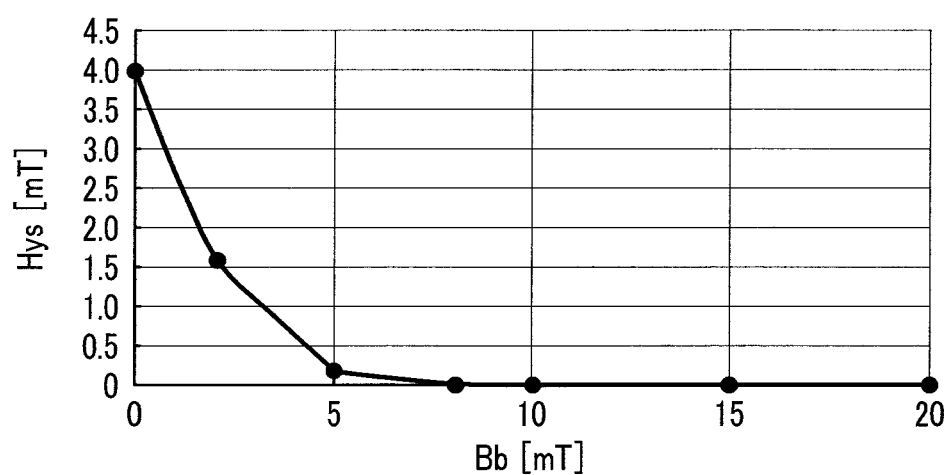
FIG. 18 is a characteristic chart showing a relationship between the bias magnetic field and a hysteresis, determined by the third simulation.

FIG. 18 is a characteristic chart showing the relationship between the bias magnetic field MFb and the hysteresis Hys. In FIG. 18, the horizontal axis indicates the magnetic flux density Bb corresponding to the strength of the bias magnetic field MFb, and the vertical axis the hysteresis Hys. FIG. 18 shows that the hysteresis Hys decreases as the strength of the bias magnetic field MFb (magnetic flux density Bb) decreases.

The error in the detection value Vs can occur due to the hysteresis Hys, as well as the foregoing angular error. The upper limit value of the hysteresis Hys at which the error in the detection value Vs is allowable is 1 mT, for example. From FIG. 18, the magnetic flux density Bb at which the hysteresis Hys is 1 mT is 3 mT. The magnetic flux density Bb corresponding to the strength of the bias magnetic field MFb is thus preferably greater than or equal to 3 mT.

If the strength of the bias magnetic field MFb is increased, the strength of the magnetic field component MFx needs to be increased to reduce the output change rate. To increase the strength of the magnetic field component MFx, the gap AG needs to be reduced, for example. In view of securing a somewhat large gap AQ the magnetic flux density Bb corresponding to the strength of the bias magnetic field MFb is preferably less than or equal to 40 mT.

The bias magnetic field MFb is attributed to either the external magnetic field generated by the bias magnetic field generator 50B or the anisotropic magnetic field due to the anisotropy of the free layer 53 in each MR element 50, or both. If the magnet pair 50C (first and second magnets 54 and 55) is provided as the bias magnetic field generator 50B, the direction of the bias magnetic field MFb can be set to one direction (Y direction or −Y direction). The magnitude of each of the first and second detection signals S1 and S2 when the strength of the magnetic field component MFx is 0, i.e., the offset of the detection signal can be different depending on whether the magnetization direction of the free layer 53 is the Y direction or −Y direction. By contrast, the provision of the magnet pair 50C (first and second magnets 54 and 55) can fix the magnetization direction of the free layer 53 when the strength of the magnetic field component MFx is 0 to one direction (Y direction or −Y direction). This facilitates offset correction.

By somewhat increasing the strength of the external magnetic field generated by the bias magnetic field generator 50B, the magnetization direction of the free layer 53 when the strength of the magnetic field component MFx is 0 can be prevented from being reversed to change the offset if a magnetic field in a direction opposite to the direction of the external magnetic field is applied to the MR element 50. Even from such a point of view, the magnetic flux density Bb corresponding to the strength the bias magnetic field MFb is preferably somewhat high, or greater than or equal to 3 mT in particular.

Next, the other effects of the present embodiment will be described. In the present embodiment, the plurality of MR elements 50 are arranged to reduce the components corresponding to the eleventh and lower, odd-order harmonics included in the error components of each of the first and second detection signals S1 and S2. As can be seen from the result of the second simulation, the component corresponding to the thirteenth-order harmonic included in the error components increases as the magnetic field ratio, or the strength of the magnetic field component MFx in particular, increases. If the plurality of MR elements 50 are not arranged as described above, the components corresponding to the eleventh and lower, odd-order harmonics also increase as the strength of the magnetic field component MFx increases. In such a case, the waveforms of the first and second detection signals S1 and S2 are distorted to be rectangular. As a result, the error in the detection value Vs increases.

By contrast, according to the present embodiment, the plurality of MR elements 50 are arranged as described above. This can reduce the error components included in each of the first and second detection signals S1 and S2 and bring the waveform of each of the first and second detection signals S1 and S2 close to an ideal sinusoidal curve while increasing the strength of the magnetic field component MFx. As a result, according to the present embodiment, the error in the detection value Vs can be reduced and the output change rate can be reduced as well.

Figure 19:
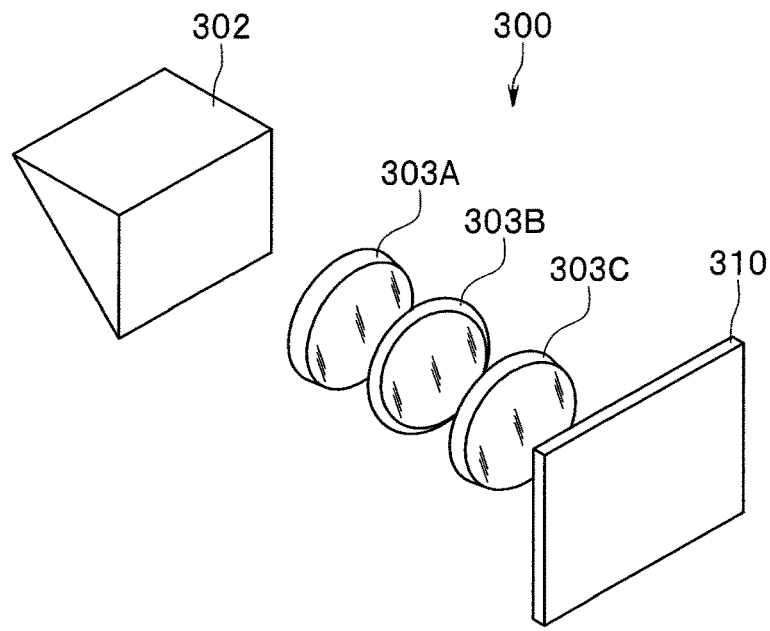
FIG. 19 is a perspective view showing a lens module including a position detection device according to the embodiment of the invention.
Figure 20:
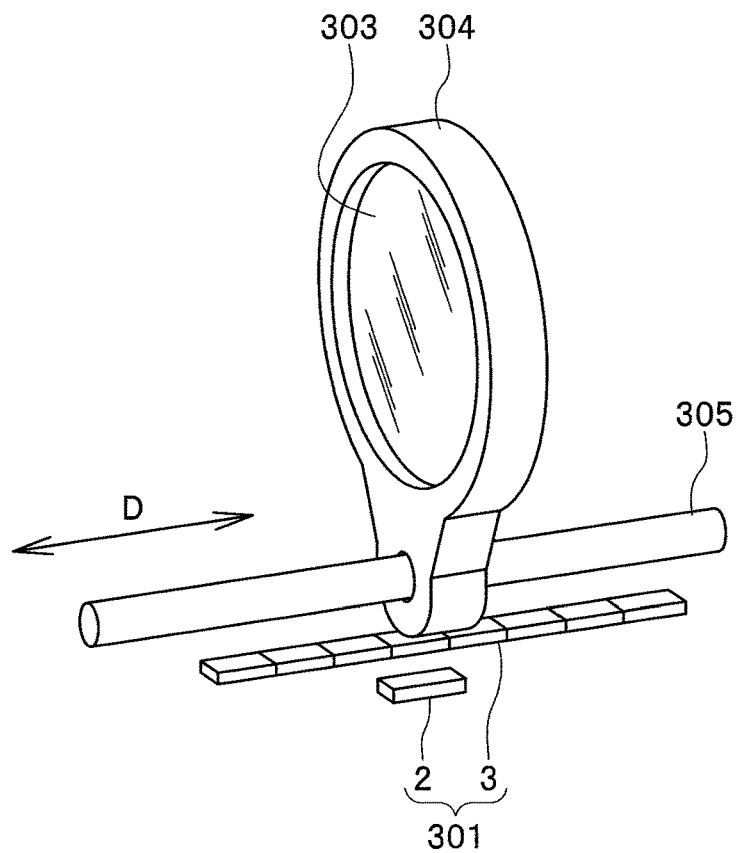
FIG. 20 is a perspective view showing the position detection device according to the embodiment of the invention.

Next, a lens position detection device (hereinafter, referred to simply as a position detection device) according to the present embodiment will be described with reference to FIGS. 19 and 20. FIG. 19 is a perspective view showing a lens module including the position detection device according to the present embodiment. FIG. 20 is a perspective view showing the position detection device according to the present embodiment.

A lens module 300 shown in FIG. 19 constitutes a part of a smartphone camera, for example. The lens module 300 is used in combination with an image sensor 310 using a complementary metal-oxide-silicon (CMOS) sensor or the like. In the example shown in FIG. 19, the lens module 300 includes a triangular prism 302, and three lenses 303A, 303B, and 303C located between the image sensor 310 and the prism 302. At least one of the lenses 303A, 303B, and 303C is configured to be movable by a not-shown driving unit so that at least either focusing or zooming can be performed.

FIG. 20 shows a lens 303 among the lenses 303A, 303B, and 303C. The lens module 300 further includes a lens holder 304 that holds the lens 303, and a shaft 305. The lens module 300 can change the position of the lens 303 in an optical axis direction of the lens 303 by using the lens holder 304, the shaft 305, and the not-shown driving unit. In FIG. 20, the arrow denoted by the symbol D indicates the moving direction of the lens 303.

The lens module 300 further includes a position detection device 301 for detecting the position of the lens 303 whose position is variable. The position detection device 301 is used to detect the position of the lens 303 in performing focusing or zooming.

The position detection device 301 is a magnetic position detection device, and includes the magnetic sensor system 1 according to the present embodiment. In the lens module 300, the magnetic sensor 2 and the magnetic field generator 3 of the magnetic sensor system 1 are configured so that the strength of the magnetic field component MFx (see FIG. 2) changes as the position of the lens 303 changes in the moving direction D. Specifically, the magnetic sensor 2 is fixed, and the magnetic field generator 3 is configured to be movable with the lens 303 in the moving direction D. The moving direction D is parallel to the X direction shown in FIGS. 1 and 2. When the position of the lens 303 changes, the position of the magnetic field generator 3 relative to the magnetic sensor 2 thus changes, and as a result, the strength of the magnetic field component MFx changes.

The position detection device 301 further includes the detection value generation circuit 4 of the present embodiment (see FIG. 4). The position detection device 301 generates a detection value Vs having a correspondence with the position of the lens 303 on the basis of the first and second detection signals S1 and S2 generated by the magnetic sensor 2. The position of the lens 303 has a correspondence with the position of the magnetic field generator 3 relative to the magnetic sensor 2. The method for generating the detection value Vs by the position detection device 301 is the same as the foregoing method for generating the detection value Vs.

MODIFICATION EXAMPLES

Figure 21:
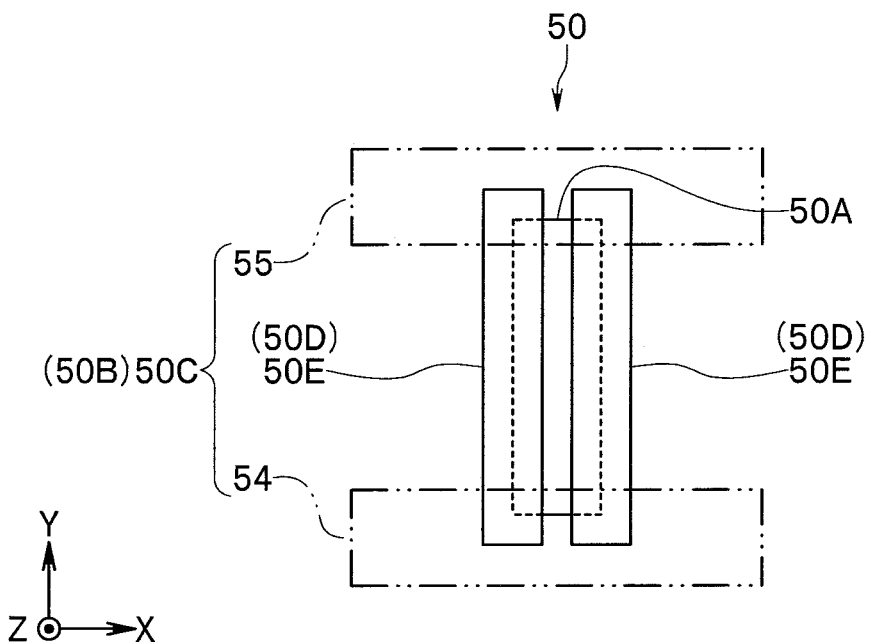
FIG. 21 is a perspective view showing a first modification example of a magnetoresistive element of the embodiment of the invention.

Next, modification examples of the MR element 50 of the present embodiment will be described. A first modification example of the MR element 50 will initially be described with reference to FIG. 21. In the first modification example, two of the plurality of soft magnetic layers 50E are located to overlap the same MR element 50 when seen in the Z direction. The two soft magnetic layers 50E are arranged in the X direction at a predetermined distance from each other. One of the two soft magnetic layers 50E is located near the end of the layered film 50A in the −X direction. The other of the two soft magnetic layers 50E is located near the end of the layered film 50A in the X direction. The two soft magnetic layers 50E are located between the layered film 50A and the magnet pair 50C (first and second magnets 54 and 55). The two soft magnetic layers 50E each have a planar shape long in the Y direction.

Figure 22:
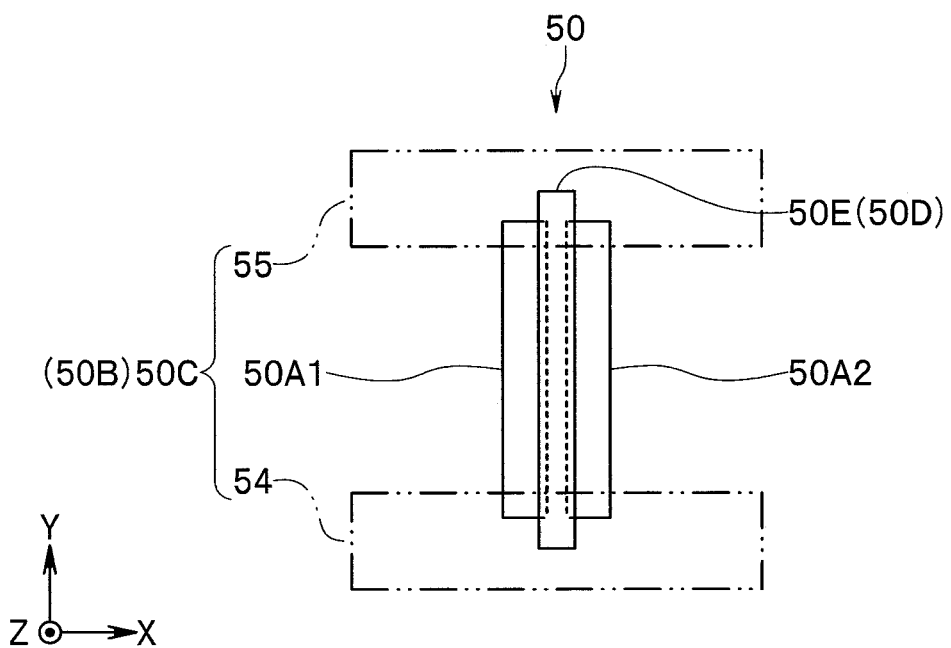
FIG. 22 is a plan view showing a second modification example of the magnetoresistive element of the embodiment of the invention.

Next, a second modification example of the MR element 50 will be described with reference to FIG. 22. In the second modification example, the MR element 50 includes two layered films 50A1 and 50A2 instead of the layered film 50A shown in FIGS. 7 and 8. The layered films 50A1 and 50A2 each have the same configuration and shape as those of the layered film 50A. The layered films 50A1 and 50A2 are connected in parallel by electrodes to constitute a layered film pair. The layered film pair is connected to the layered film pair of another MR element 50 in series by an electrode. For example, the bottom surfaces of the respective layered films 50A1 and 50A2 are electrically connected to the bottom surfaces of the respective layered films 50A1 and 50A2 of another MR element 50 by a not-shown lower electrode. The top surfaces of the respective layered films 50A1 and 50A2 are electrically connected to the top surfaces of the respective layered films 50A1 and 50A2 of yet another MR element 50 by a not-shown upper electrode.

In the second modification example, the first magnet 54 of the magnet pair 50C is located near the ends of the respective layered films 50A1 and 50A2 in the −Y direction. The second magnet 55 is located near the ends of the respective layered films 50A1 and 50A2 in the Y direction. The soft magnetic layer 50E is located to overlap both the layered films 50A1 and 50A2 when seen in the Z direction.

The configurations of the MR elements 50, the magnet pairs 50C, and the soft magnetic layers 50E are not limited to the examples shown in FIGS. 7, 8, 21, and 22. For example, the number of layered films included in an MR element 50 is one in the examples shown in FIGS. 7, 8, and 21, and two in the example shown in FIG. 22. However, the number of layered films may be three or more. The number of soft magnetic layers 50E overlapping an MR element 50 is one in the examples shown in FIGS. 7, 8, and 22, and two in the example shown in FIG. 21. However, the number of soft magnetic layers 50E may be three or more, or zero.

A case where a plurality of layered films are arranged in the X direction and a plurality of soft magnetic layers 50E are arranged in the X direction will be described below as an example. Suppose, for example, that the number of layered films is two and the number of soft magnetic layers 50E is two. In such a case, a first soft magnetic layer 50E may be located to overlap a first layered film when seen in the Z direction, and a second soft magnetic layer 50E may be located to overlap a second layered film when seen in the Z direction.

If the number of layered films is two and the number of soft magnetic layers 50E is three, a first soft magnetic layer 50E may be located to overlap only a first layered film when seen in the Z direction. A second soft magnetic layer 50E may be located to overlap both the first layered film and a second layered film when seen in the Z direction. A third soft magnetic layer 50E may be located to overlap only the second layered film when seen in the Z direction.

If the number of layered films is three and the number of soft magnetic layers 50E is two, a first soft magnetic layer 50E may be located to overlap both first and second layered films when seen in the Z direction. A second soft magnetic layer 50E may be located to overlap both the second layered film and a third layered film when seen in the Z direction.

If the number of layered films is three and the number of soft magnetic layers 50E is four, a first soft magnetic layer 50E may be located to overlap only a first layered film when seen in the Z direction. A second soft magnetic layer 50E may be located to overlap both the first layered film and a second layered film when seen in the Z direction. A third soft magnetic layer 50E may be located to overlap both the second layered film and a third layered film when seen in the Z direction. A fourth soft magnetic layer 50E may be located to overlap only the third layered film when seen in the Z direction.

The present invention is not limited to the foregoing embodiment, and various modifications may be made thereto. For example, the shape, number, and layout of the MR elements 50 are not limited to the examples described in the embodiment, and may be freely set as long as the requirements set forth in the claims are satisfied. The planar shape of the MR elements 50 is not limited to rectangular, and may be circular, elliptical, etc.

Each resistor may include only the element groups 501 to 504 and 509 to 512 among the element groups 501 to 516 shown in FIG. 6. This enables reduction of the components corresponding to the seventh and lower, odd-order harmonics included in the error components.

The magnetic field generator 3 may be a rotary scale magnetized to a plurality of pairs of N and S poles along the direction of rotation. The rotary scale may be a ring-shaped magnet, or a magnetic medium, such as a magnetic tape, fixed to a ring or a disc.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:
1. A magnetic sensor system comprising:
a magnetic field generator configured to generate a target magnetic field; and
a magnetic sensor configured to detect the target magnetic field, wherein
the magnetic sensor and the magnetic field generator are configured so that a strength of a magnetic field component of the target magnetic field detected by the magnetic sensor in a first direction changes with a change in a position of the magnetic field generator relative to the magnetic sensor,
the magnetic sensor includes a plurality of magnetoresistive elements,
the plurality of magnetoresistive elements each include a magnetization pinned layer having a magnetization whose direction is fixed, a free layer having a magnetization whose direction is variable depending on a direction and the strength of the magnetic field component, and a gap layer located between the magnetization pinned layer and the free layer, and are configured so that a bias magnetic field in a second direction orthogonal to the first direction is applied to the free layer, and to change in resistance with the strength of the magnetic field component; and
a maximum strength of the magnetic field component applied to each of the magnetoresistive elements is greater than or equal to 1.2 times a strength of the bias magnetic field.

2. The magnetic sensor system according to claim 1, wherein the maximum strength of the magnetic field component applied to each of the magnetoresistive elements is less than or equal to 15.6 times the strength of the bias magnetic field.

3. The magnetic sensor system according to claim 1, wherein the bias magnetic field is attributed to either an external magnetic field applied to the free layer from outside or an anisotropic magnetic field due to anisotropy of the free layer, or both.

4. The magnetic sensor system according to claim 1, wherein
the magnetic sensor further includes a bias magnetic field generator configured to generate an external magnetic field to be applied to the free layer, and
the bias magnetic field is attributed to at least the external magnetic field.

5. The magnetic sensor system according to claim 4, wherein
the bias magnetic field generator includes a plurality of magnet pairs each including a first magnet and a second magnet, and
the first and second magnets in each of the magnet pairs are located at a predetermined distance from each other in the second direction so that the external magnetic field is applied to the entire free layer of at least one magnetoresistive element among the plurality of magnetoresistive elements.

6. The magnetic sensor system according to claim 5, wherein
the magnetization pinned layer, the free layer, and the gap layer constitute a layered film,
the layered film has a width that is a dimension in a direction parallel to the first direction, and
the width of the layered film is less than or equal to the distance between the first and second magnets in each of the magnet pairs.

7. The magnetic sensor system according to claim 1, wherein
the free layer has magnetic shape anisotropy; and
the bias magnetic field is attributed to at least the magnetic shape anisotropy.

8. The magnetic sensor system according to claim 1, wherein the magnetic sensor further includes a magnetic field amplifier configured to amplify the magnetic field component to be applied to each of the magnetoresistive elements.

9. The magnetic sensor system according to claim 8, wherein
the magnetic field amplifier includes a plurality of soft magnetic layers, and
the plurality of soft magnetic layers each are located to overlap at least one magnetoresistive element among the plurality of magnetoresistive elements when seen in a third direction orthogonal to the first and second directions.

10. The magnetic sensor system according to claim 1, wherein the gap layer is a tunnel barrier layer.

11. The magnetic sensor system according to claim 1, wherein
the magnetic field generator is a magnetic scale including a plurality of pairs of N and S poles alternately arranged at a predetermined pitch in a predetermined direction,
the magnetic sensor generates a detection signal having a correspondence with the resistance of each of the magnetoresistive elements,
the detection signal includes an ideal component that changes periodically to trace an ideal sinusoidal curve, and an error component including a plurality of harmonics of the ideal component, and
the plurality of magnetoresistive elements are arranged in a predetermined pattern based on the predetermined pitch so that the error component is reduced.

12. The magnetic sensor system according to claim 11, wherein the plurality of magnetoresistive elements are arranged to reduce components corresponding to at least seventh and lower, odd-order harmonics included in the error component.

13. The magnetic sensor system according to claim 1, further comprising a detection value generation circuit configured to generate a detection value having a correspondence with the position of the magnetic field generator relative to the magnetic sensor based on the resistance of each of the magnetoresistive elements.

14. A lens position detection device that detects a position of a lens whose position is variable, the lens position detection device comprising the magnetic sensor system according to claim 1, wherein
the lens is configured to be movable in the first direction,
the magnetic sensor and the magnetic field generator are configured so that the strength of the magnetic field component changes as the position of the lens changes.

15. The lens position detection device according to claim 14, further comprising a detection value generation circuit configured to generate a detection value having a correspondence with the position of the lens based on the resistance of each of the magnetoresistive elements.

* * * * *